US012568765B2

(12) United States Patent (10) Patent No.: US 12,568,765 B2

Morishita (45) Date of Patent: Mar. 3, 2026

(54) PIEZOELECTRIC THIN FILM ELEMENT AND PIEZOELECTRIC TRANSDUCER

(71) Applicant: TDK Corporation, Tokyo (JP)

(72) Inventor: Junpei Morishita, Tokyo (JP)

(73) Assignee: TDK Corporation, Tokyo (JP)

( * ) Notice: Subject to any disclaimer, the term of this patent is extended or adjusted under 35 U.S.C. 154(b) by 660 days.

(21) Appl. No.: 17/895,672

(22) Filed: Aug. 25, 2022

(65) Prior Publication Data

US 2023/0292621 A1 Sep. 14, 2023

(30) Foreign Application Priority Data

Mar. 14, 2022 (JP) ................................. 2022-038942

(51) Int. Cl.
H10N 30/50 (2023.01)
H10N 30/853 (2023.01)
H10N 30/87 (2023.01)

(52) U.S. Cl.
CPC ......... H10N 30/50 (2023.02); H10N 30/8536 (2023.02); H10N 30/878 (2023.02)

(58) Field of Classification Search
CPC .. H10N 30/50; H10N 30/8536; H10N 30/878; H10N 30/076; H10N 30/708; H10N 30/8561
See application file for complete search history.

(56) References Cited

U.S. PATENT DOCUMENTS 6,258,459 B1 * 7/2001 Noguchi ................. B32B 15/04
428/700
2005/0218756 A1 * 10/2005 Fujii ...................... B41J 2/1632
310/358
2006/0279178 A1 * 12/2006 Ren ......................... H10N 30/04
310/358

(Continued)

FOREIGN PATENT DOCUMENTS

DE 102022104926 A1 9/2022

OTHER PUBLICATIONS

Y. Kawahara, et al., "Control of Crystal Structure of $BiFeO_3$ Epitaxial Thin Films by Adjusting Growth Conditions and Piezoelectric Properties," Japanese Journal of Applied Physics, 51(2012), Sep. 20, 2012, p. 09LB04-1-p. 09LB04-5.

(Continued)

*Primary Examiner* — Emily P Pham

(74) *Attorney, Agent, or Firm* — Faegre Drinker Biddle & Reath LLP

(57) ABSTRACT

A piezoelectric thin film element contains an electrode layer (first electrode layer) and a piezoelectric thin film directly or indirectly stacked on the electrode layer. The piezoelectric thin film contains a tetragonal crystal 1 of a perovskite-type oxide and a tetragonal crystal 2 of a perovskite-type oxide. A (001) plane of the tetragonal crystal 1 is oriented in a normal direction of a surface of the electrode layer. A (001) plane of the tetragonal crystal 2 is inclined with respect to the (001) plane of the tetragonal crystal 1. A spacing of (001)

(Continued)

planes of the tetragonal crystal 1 is c1. A spacing of (100) planes of the tetragonal crystal 1 is a1. A spacing of (001) planes of the tetragonal crystal 2 is c2. A spacing of (100) planes of the tetragonal crystal 2 is a2. c1/a1 is larger than c2/a2.

13 Claims, 6 Drawing Sheets

(56) References Cited

U.S. PATENT DOCUMENTS

2015/0077474 A1* 3/2015 Mawatari ............. B41J 2/14201
347/68
2022/0367785 A1 11/2022 Morishita

OTHER PUBLICATIONS

Japanese Office Action issued Nov. 11, 2025 in Application No. 2022-038942.
Reasons for Refusal for Japanese Patent Application No. 2022038942, mailed Nov. 7, 2025.

* cited by examiner

PIEZOELECTRIC THIN FILM ELEMENT AND PIEZOELECTRIC TRANSDUCER

TECHNICAL FIELD

The present disclosure relates to a piezoelectric thin film element (piezoelectric thin film device), and a piezoelectric transducer.

BACKGROUND

A piezoelectric material is processed into various piezoelectric elements for various purposes of use. For example, a piezoelectric actuator converts a voltage into a force by an inverse piezoelectric effect that deforms a piezoelectric material by applying a voltage to the piezoelectric material. Furthermore, a piezoelectric sensor converts a force into a voltage by a piezoelectric effect that deforms a piezoelectric material by applying a pressure to the piezoelectric material to cause electric polarization. These piezoelectric elements are mounted on various electronic devices.

In recent years, in the market, miniaturization and improvement in performance of electronic devices are demanded, and thus a piezoelectric element using a piezoelectric thin film (piezoelectric thin film element) has been studied actively. However, since it is difficult to obtain a piezoelectric effect and an inverse piezoelectric effect as the thickness of a piezoelectric material decreases, development of a piezoelectric material having excellent piezoelectric properties in a thin film state has been expected.

Conventionally, as a piezoelectric material, lead zirconate titanate (so-called PZT) that is a perovskite-type ferroelectric material has been used frequently. However, since PZT contains lead (Pb) that harms the environment and human body, development of a lead-free piezoelectric material as an alternative to PZT has been expected. For example, in Y. Kawahara et al, Control of Crystal Structure of $BiFeO_3$ Epitaxial Thin Films by Adjusting Growth Conditions and Piezoelectric Properties, Japanese Journal of Applied Physics. 51 (2012) 09LB04, $BiFeO_3$ is described as an example of lead-free piezoelectric materials. $BiFeO_3$ has relatively excellent piezoelectric properties among lead-free piezoelectric materials, and thus is expected to be applied particularly to a piezoelectric thin film element.

SUMMARY

Main indices (piezoelectric constants) showing the performance of the piezoelectric material are $d_{33,f}$ (piezoelectric strain constant) and $g_{33}$ (piezoelectric output constant). The piezoelectric strain constant $d_{33,f}$ (unit: pC/N) is an index of the strain amount per unit electric field (signal sending ability). As the piezoelectric strain constant $d_{33,f}$ increases, the performance of the piezoelectric material as an actuator is improved. Meanwhile, the piezoelectric output constant $g_{33}$ (unit: $\times 10^{-3}$ V·m/N) is an index of the strength of electric field generated per unit stress (signal receiving ability). As the piezoelectric output constant $g_{33}$ increases, the performance of the piezoelectric material as a sensor such as a transducer is improved. $g_{33}$ is represented as $di_{33,f}/\varepsilon_r\varepsilon_0$ or $d_{33,f}/\varepsilon_{33}\varepsilon_0$. $\varepsilon_r$ or $\varepsilon_{33}$ is a relative permittivity (unit: none) of the piezoelectric material. $\varepsilon_0$ is a permittivity of vacuum ($8.854\times10^{-12}$ $Fm^{-1}$). $d_{33,f}/\varepsilon_r\varepsilon_0$ is described as "piezoelectric performance index". The piezoelectric performance index increases with an increase in $d_{33,f}$, and the piezoelectric performance index increases with a decrease in $\varepsilon_r$. That is, the piezoelectric performance index ($d_{33,f}/\varepsilon_r\varepsilon_0$) is increased by achieving both of a large piezoelectric strain constant $d_{33,f}$ and a low relative permittivity $\varepsilon_r$.

An object of an aspect of the present invention is to provide a piezoelectric thin film element having a large piezoelectric performance index ($d_{33,f}/\varepsilon_r\varepsilon_0$) and a piezoelectric transducer containing this piezoelectric thin film element.

A piezoelectric thin film element (piezoelectric thin film device) according to an aspect of the present invention contains an electrode layer and a piezoelectric thin film directly or indirectly stacked on the electrode layer. The piezoelectric thin film contains a tetragonal crystal 1 of a perovskite-type oxide and a tetragonal crystal 2 of a perovskite-type oxide. A (001) plane of the tetragonal crystal 1 is oriented in a normal direction of a surface of the electrode layer. ((001) planes of the tetragonal crystal 1 may be oriented in the normal direction of the surface of the electrode layer.) A (001) plane of the tetragonal crystal 2 is inclined with respect to the (001) plane of the tetragonal crystal 1. ((001) planes of the tetragonal crystal 2 may be inclined with respect to (001) planes of the tetragonal crystal 1.) A spacing of (001) planes of the tetragonal crystal 1 is c1. A spacing of (100) planes of the tetragonal crystal 1 is a1. A spacing of (001) planes of the tetragonal crystal 2 is c2. A spacing of (100) planes of the tetragonal crystal 2 is a2. c1/a1 is larger than c2/a2.

An absolute value of an angle between the (001) plane of the tetragonal crystal 1 and the (001) plane of the tetragonal crystal 2 is $\theta_{12}$. The $\theta_{12}$ may be from 1.0° to 10.0°.

The c1/a1 may be from 1.120 to 1.270.

The c2/a2 may be from 1.010 to 1.115.

A peak intensity of diffracted X-rays of the (001) plane(s) of the tetragonal crystal 1 is $I_1$. A peak intensity of diffracted X-rays of the (001) plane(s) of the tetragonal crystal 2 is $I_2$. $100\times I_2/(I_1+I_2)$ may be from 0.30 to 10.0.

The tetragonal crystal 1 may contain bismuth, iron, an element $E^B$, and oxygen. The element $E^B$ may be at least one element selected from the group consisting of magnesium, aluminum, zirconium, titanium, nickel, and zinc.

The tetragonal crystal 1 may be represented by Chemical Formula 1 below. $E^A$ in Chemical Formula 1 below may be at least one element selected from the group consisting of Na, K, Ag, and Ba. $E^{B1}$ in Chemical Formula 1 below may be at least one element selected from the group consisting of Mg, Al, Zr, Ti, Ni, and Zn. $E^{B2}$ in Chemical Formula 1 below may be at least one element selected from the group consisting of Mg, Al, Zr, Ti, Ni, and Zn. The $E^{B1}$ and the $E^{B2}$ in Chemical Formula 1 below are different from each other. x1 in Chemical Formula 1 below may be from 0.05 to 0.90. y1 in Chemical Formula 1 below may be from 0.10 to 0.95. x1+y1 may be 1.00. $\alpha$ in Chemical Formula 1 below may be from 0.00 to 1.00. $\beta$ in Chemical Formula 1 below may be from 0.00 to 1.00.

$$x1(Bi_{1-\alpha}E^A{}_\alpha)(E^{B1}{}_{1-\beta}E^{B2}{}_\beta)O_3-y1BiFeO_3 \tag{1}$$

The tetragonal crystal 2 may contain bismuth, iron, an element $E^B$, and oxygen. The element $E^B$ may be at least one element selected from the group consisting of magnesium, aluminum, zirconium, titanium, nickel, and zinc.

The tetragonal crystal 2 may be represented by Chemical Formula 2 below. $E^A$ in Chemical Formula 2 below may be at least one element selected from the group consisting of Na, K, Ag, and Ba. $E^{B1}$ in Chemical Formula 2 below may be at least one element selected from the group consisting of Mg, Al, Zr, Ti, Ni, and Zn. $E^{B2}$ in Chemical Formula 2 below may be at least one element selected from the group consisting of Mg, Al, Zr, Ti, Ni, and Zn. The $E^{B1}$ and the $E^{B2}$ in Chemical Formula 2 below are different from each other. x2 in Chemical Formula 2 below may be from 0.05 to 0.90. y2 in Chemical Formula 2 below may be from 0.10 to 0.95. x2+y2 may be 1.00. $\alpha$ in Chemical Formula 2 below may be from 0.00 to 1.00. $\beta$ in Chemical Formula 2 below may be from 0.00 to 1.00.

$$x2(Bi_{1-\alpha}E^A_\alpha)(E^{B1}_{1-\beta}E^{B2}_\beta)O_3 - y2BiFeO_3 \qquad (2)$$

The piezoelectric thin film element according to the aspect of the present invention may further contain a crystalline substrate and a first intermediate layer. The first intermediate layer may be disposed between the crystalline substrate and the electrode layer. The first intermediate layer may contain $ZrO_2$ and $Y_2O_3$.

The piezoelectric thin film element according to the aspect of the present invention may further contain a second intermediate layer. The second intermediate layer may be disposed between the electrode layer and the piezoelectric thin film. The second intermediate layer may contain at least one compound selected from the group consisting of $BaTiO_3$, $SrRuO_3$, and $LaNiO_3$.

The electrode layer may contain a platinum crystal. A (002) plane ((002) planes) of the platinum crystal may be oriented in the normal direction of the surface of the electrode layer. A (200) plane ((200) planes) of the platinum crystal may be oriented in an in-plane direction of the surface of the electrode layer.

A piezoelectric transducer according to an aspect of the present invention contains the above-described piezoelectric thin film element.

According to an aspect of the present invention, there are provided a piezoelectric thin film element having a large piezoelectric performance index ($d_{33,f}/\varepsilon_r\varepsilon_0$) and a piezoelectric transducer containing this piezoelectric thin film element.

BRIEF DESCRIPTION OF THE DRAWINGS

FIG. 3A is a schematic perspective view of a unit cell of a tetragonal crystal 1, and FIG. 3B is a schematic perspective view of a unit cell of a tetragonal crystal 2.

DETAILED DESCRIPTION

Figure 1A:
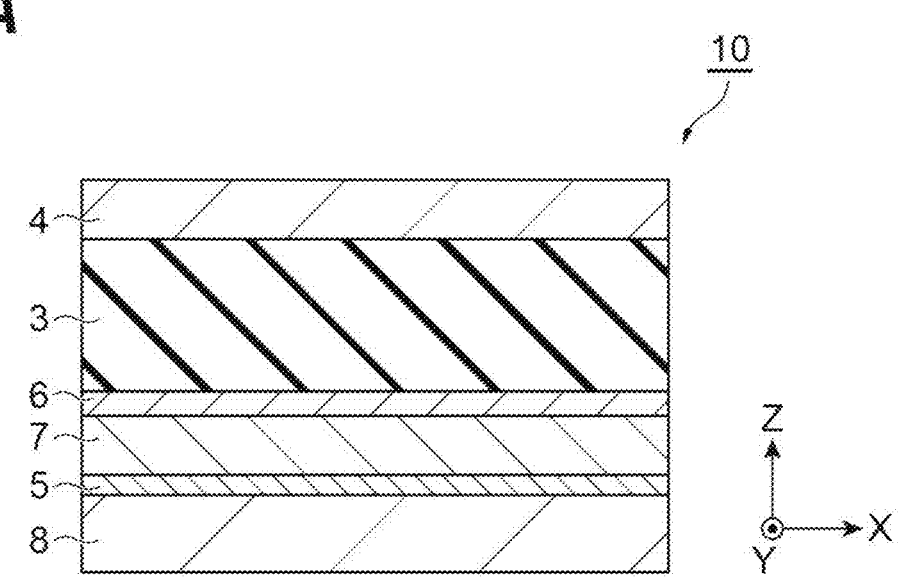
FIG. 1A is a schematic cross-sectional view of a piezoelectric thin film element according to an embodiment of the present invention.
Figure 1B:
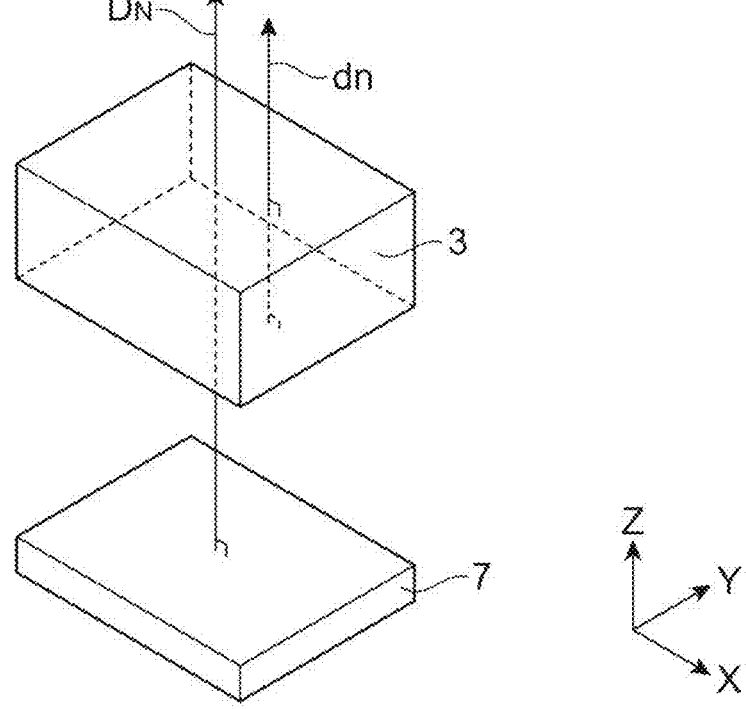
FIG. 1B is an exploded perspective view of the piezoelectric thin film element illustrated in FIG. 1A.
Figure 5:
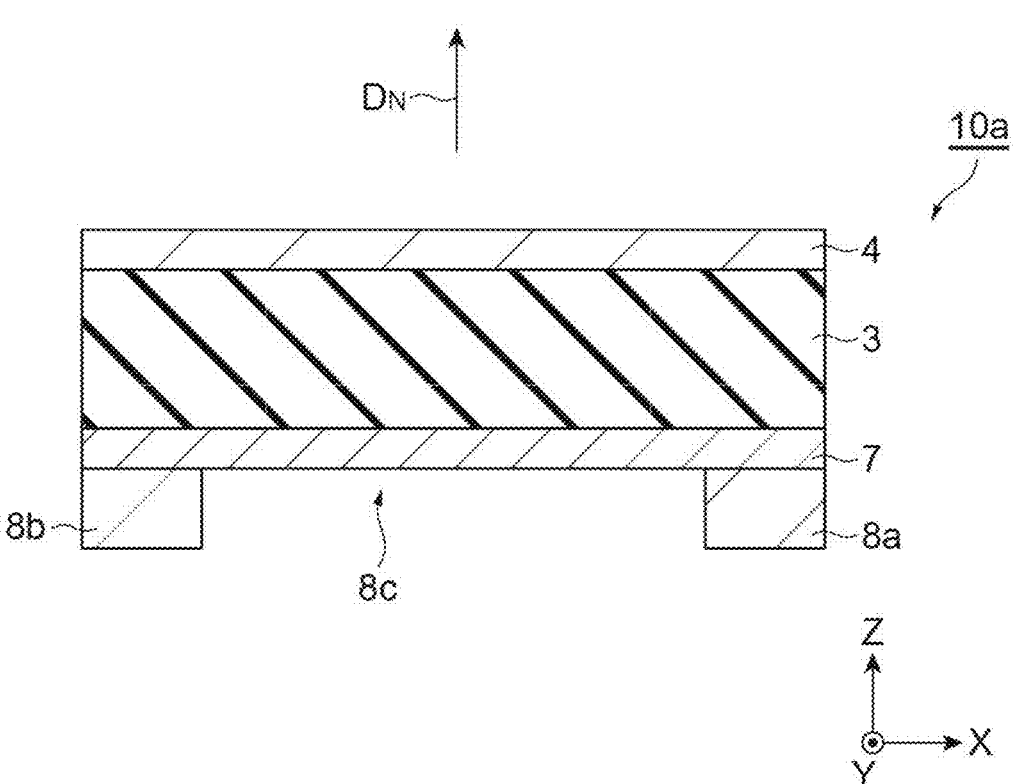
FIG. 5 is a schematic cross-sectional view of a piezoelectric thin film element (ultrasonic transducer) according to another embodiment of the present invention.

Hereinafter, details of preferred embodiments of the present invention will be described with reference to the drawings. However, the present invention is not limited to the following embodiments. In the drawings, the same or equivalent elements are designated by the same reference numerals. X, Y and Z axes shown in FIG. 1A, FIG. 1B, and FIG. 5 are three coordinate axes orthogonal to one another. The direction of each of the three coordinate axes is common to FIG. 1A, FIG. 1B, and FIG. 5.

A piezoelectric thin film element according to the present embodiment contains an electrode layer and a piezoelectric thin film directly or indirectly stacked on the electrode layer. FIG. 1A is a cross-sectional view of a piezoelectric thin film element 10 according to the present embodiment. The cross-section illustrated in FIG. 1A is perpendicular to a surface of each of a first electrode layer 7 and a piezoelectric thin film 3. The piezoelectric thin film element 10 contains a crystalline substrate 8, a first electrode layer 7 (lower electrode layer) directly or indirectly stacked on the crystalline substrate 8, a piezoelectric thin film 3 directly or indirectly stacked on the first electrode layer 7, and a second electrode layer 4 (upper electrode layer) directly or indirectly stacked on the piezoelectric thin film 3. The piezoelectric thin film element 10 may further contain a first intermediate layer 5. The first intermediate layer 5 may be disposed between the crystalline substrate 8 and the first electrode layer 7, and the first electrode layer 7 may be directly stacked on a surface of the first intermediate layer 5. The piezoelectric thin film element 10 may further contain a second intermediate layer 6. The second intermediate layer 6 may be disposed between the first electrode layer 7 and the piezoelectric thin film 3, and the piezoelectric thin film 3 may be directly stacked on a surface of the second intermediate layer 6.

FIG. 1B is an exploded perspective view of the piezoelectric thin film element 10. In the exploded perspective view illustrated in FIG. 1B, the crystalline substrate 8, the first intermediate layer 5, the second intermediate layer 6, and the second electrode layer 4 are omitted. A normal direction $D_N$ of a surface of the first electrode layer 7 may be substantially parallel to a direction (Z-axis direction) in which the crystalline substrate 8, the first intermediate layer 5, the first electrode layer 7, the second intermediate layer 6, the piezoelectric thin film 3, and the second electrode layer 4 are laminated. The normal direction $D_N$ of the surface of the first electrode layer 7 may be restated as a thickness direction of the first electrode layer 7. A normal direction dn of the surface of the piezoelectric thin film 3 may be substantially parallel to the normal direction $D_N$ of the surface of the first electrode layer 7. That is, the surface of the piezoelectric thin film 3 may be substantially parallel to the surface of the first electrode layer 7. The normal direction dn of the surface of the piezoelectric thin film 3 may be restated as a thickness direction of the piezoelectric thin film 3. The thickness of each of the crystalline substrate 8, the first intermediate layer 5, the first electrode layer 7, the second intermediate layer 6, the piezoelectric thin film 3, and the second electrode layer 4 may be uniform.

A modification example of the piezoelectric thin film element 10 does not have to contain the crystalline substrate 8. For example, the crystalline substrate 8 may be removed after the formation of the first electrode layer 7 and the piezoelectric thin film 3. A modification example of the piezoelectric thin film element 10 does not have to contain the second electrode layer 4. For example, a piezoelectric thin film element not containing a second electrode layer may be supplied as a product to a manufacturer of an electronic device, and then the second electrode layer may be added to the piezoelectric thin film element in the manufacturing process of the electronic device. In a case where the crystalline substrate 8 functions as an electrode layer (first electrode layer 7), a modification example of the piezoelectric thin film element 10 does not have to contain the first electrode layer 7. That is, the modification example of the piezoelectric thin film element 10 may contain the crystalline substrate 8 having a function (electrical conductivity) as an electrode layer and the piezoelectric thin film 3 directly or indirectly stacked on the crystalline substrate 8. In a case where the modification example of the piezoelectric thin film element 10 does not contain the first electrode layer 7 but contains the crystalline substrate 8 functioning as an electrode layer, at least one of the first intermediate layer 5 and the second intermediate layer 6 may be disposed between the piezoelectric thin film 3 and the crystalline substrate 8. In a case where the modification example of the piezoelectric thin film element 10 does not contain the first electrode layer 7 but contains the crystalline substrate 8 functioning as an electrode layer, the normal direction $D_N$ of the surface of the first electrode layer 7 may be restated as a normal direction of a surface of the crystalline substrate 8.

The piezoelectric thin film 3 contains a tetragonal crystal 1 of a perovskite-type oxide and a tetragonal crystal 2 of a perovskite-type oxide. Needless to say, the perovskite-type oxide is an oxide having a perovskite-type structure. The piezoelectric thin film 3 may contain one or more tetragonal crystals 1 and one or more tetragonal crystals 2. The piezoelectric thin film 3 may consist of one or more tetragonal crystals 1 and one or more tetragonal crystals 2. One or more tetragonal crystals 1 and one or more tetragonal crystals 2 may be mixed in the piezoelectric thin film 3. The piezoelectric thin film 3 may contain one or more first domains consisting of one or more tetragonal crystals 1. The piezoelectric thin film 3 may contain one or more second domains consisting of one or more tetragonal crystals 2. For example, one or more first domains and one or more second domains may be arranged (alternately) along the surface of the first electrode layer 7. One or more first domains and one or more second domains may be arranged (alternately) along the normal direction $D_N$ of the surface of the first electrode layer 7. Each first domain may be a columnar crystal extending along the normal direction $D_N$ of the surface of the first electrode layer 7. Each second domain may be a columnar crystal extending along the normal direction $D_N$ of the surface of the first electrode layer 7. The total content rate of elements constituting the tetragonal crystal 1 and the tetragonal crystal 2 in the piezoelectric thin film may be from 99 mol % to 100 mol %.

The tetragonal crystal 1 may contain bismuth (Bi), iron (Fe), an element $E^B$, and oxygen (O). The element $E^B$ may be at least one element selected from the group consisting of magnesium (Mg), aluminum (Al), zirconium (Zr), titanium (Ti), nickel (Ni), and zinc (Zn). The tetragonal crystal 1 may contain a plurality of elements $E^B$. For example, the tetragonal crystal 1 may contain $E^{B1}$ and $E^{B2}$ as the element $E^B$. The tetragonal crystal 1 may further contain an element $E^A$ in addition to Bi, Fe, $E^B$, and O. The element $E^A$ may be at least one element selected from the group consisting of sodium (Na), potassium (K), silver (Ag), and barium (Ba). The tetragonal crystal 1 may contain a plurality of $E^A$'s.

The tetragonal crystal 2 may also contain bismuth, iron, an element $E^B$, and oxygen. The element $E^B$ contained in the tetragonal crystal 2 may also be at least one element selected from the group consisting of magnesium, aluminum, zirconium, titanium, nickel, and zinc. The tetragonal crystal 2 may also contain a plurality of elements $E^B$. For example, the tetragonal crystal 2 may contain $E^{B1}$ and $E^{B2}$ as the element $E^B$. The tetragonal crystal 2 may also further contain an element $E^A$ in addition to Bi, Fe, $E^B$, and O. The element $E^A$ contained in the tetragonal crystal 2 may also be at least one element selected from the group consisting of sodium, potassium, silver, and barium. The tetragonal crystal 2 may also contain a plurality of $E^A$'s.

The composition of the tetragonal crystal 1 may be the same as the composition of the tetragonal crystal 2. The composition of the tetragonal crystal 1 may be different from the composition of the tetragonal crystal 2. The composition of each of the tetragonal crystal 1 and the tetragonal crystal 2 may be substantially the same as the composition of the entire piezoelectric thin film 3. Each of the tetragonal crystal 1 and the tetragonal crystal 2 may further contain elements other than Bi, Fe, $E^A$, $E^B$, and O. Each of the tetragonal crystal 1 and the tetragonal crystal 2 does not have to contain Pb. Each of the tetragonal crystal 1 and the tetragonal crystal 2 may contain Pb.

Figure 2:
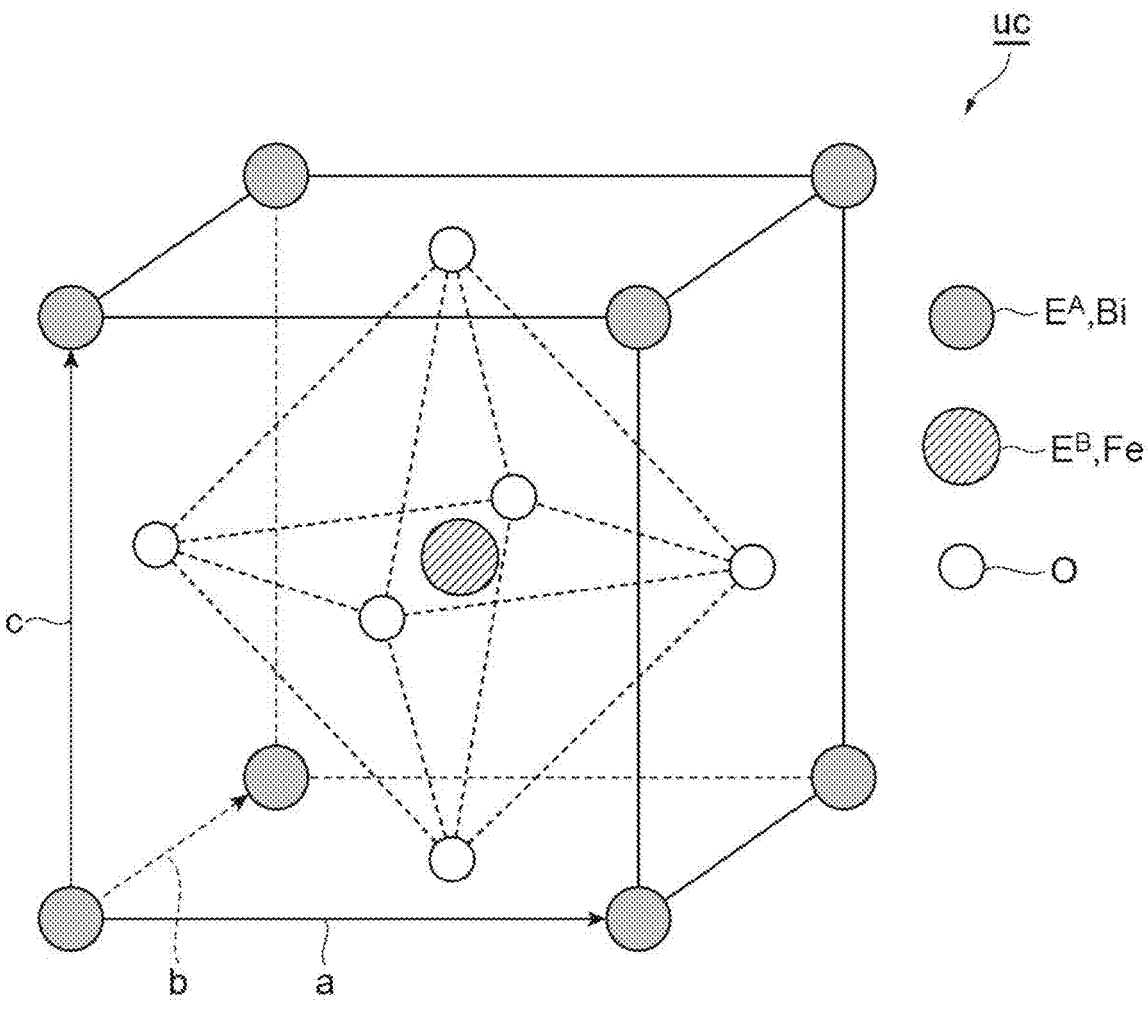
FIG. 2 is a perspective view of a unit cell of a perovskite-type structure (perovskite-type oxide).

FIG. 2 illustrates a unit cell uc of a perovskite-type oxide. Each of a, b, and c in FIG. 2 is a primitive lattice vector of the perovskite structure. An element located in the A site of the unit cell uc may be Bi or $E^A$. An element located in the B site of the unit cell uc may be Fe or $E^B$.

Figures 3A, 3B:
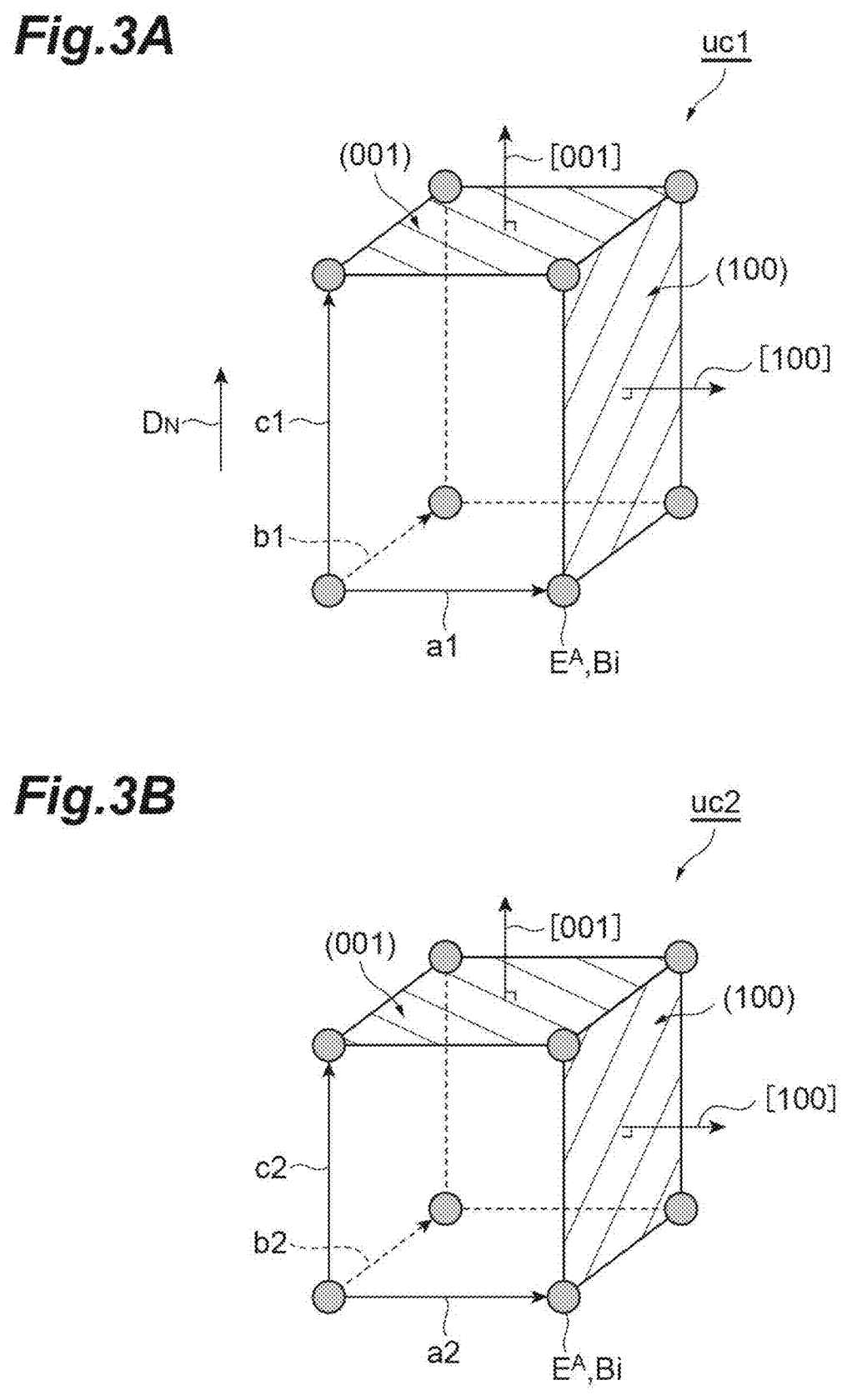

FIG. 3A illustrates a unit cell uc1 of the tetragonal crystal 1. For the sake of convenience of illustration, $E^B$ and O (oxygen) constituting the unit cell uc1 are omitted, but the unit cell uc1 in FIG. 3A has the same perovskite structure as that of the unit cell uc in FIG. 2.

Each of a1, b1, and c1 in FIG. 3A is a primitive lattice vector of the tetragonal crystal 1. The vector a1 in FIG. 3A corresponds to the vector a in FIG. 2. The vector b1 in FIG. 3A corresponds to the vector b in FIG. 2. The vector c1 in FIG. 3A corresponds to the vector c in FIG. 2. a1, b1, and c1 are perpendicular to one another. The orientation of the vector a1 (a axis) is [100]. The orientation of the vector b1 (b axis) is [010]. The orientation of the vector c1 (c axis) is [001]. A length (a1) of the vector a1 is a spacing of (100) planes of the tetragonal crystal 1 (that is, a lattice constant in the [100] direction). A length (b1) of the vector b1 is a spacing of (010) planes of the tetragonal crystal 1 (that is, a lattice constant in the [010] direction). A length (c1) of the vector c1 is a spacing of (001) planes of the tetragonal crystal 1 (that is, a lattice constant in the [001] direction). The length a1 is equal to the length b1. The length c1 is larger than the length a1.

FIG. 3B illustrates a unit cell uc2 of the tetragonal crystal 2. For the sake of convenience of illustration, $E^B$ and O (oxygen) constituting the unit cell uc2 are omitted, but the unit cell uc2 in FIG. 3B has the same perovskite structure as that of the unit cell uc in FIG. 2.

Each of a2, b2, and c2 in FIG. 3B is a primitive lattice vector of the tetragonal crystal 2. The vector a2 in FIG. 3B corresponds to the vector a in FIG. 2. The vector b2 in FIG. 3B corresponds to the vector b in FIG. 2. The vector c2 in FIG. 3B corresponds to the vector c in FIG. 2. a2, b2, and c2 are perpendicular to one another. The orientation of the vector a2 (a axis) is [100]. The orientation of the vector b2 (b axis) is [010]. The orientation of the vector c2 (c axis) is [001]. A length (a2) of the vector a2 is a spacing of (100) planes of the tetragonal crystal 2 (that is, a lattice constant in the [100] direction). A length (b2) of the vector b2 is a spacing of (010) planes of the tetragonal crystal 2 (that is, a lattice constant in the [010] direction). A length (c2) of the vector c2 is a spacing of (001) planes of the tetragonal crystal 2 (that is, a lattice constant in the [001] direction). The length a2 is equal to the length b2. The length c2 is larger than the length a2.

c1/a1 of the tetragonal crystal 1 is larger than c2/a2 of the tetragonal crystal 2. That is, the anisotropy of the tetragonal crystal 1 is larger than the anisotropy of the tetragonal crystal 2. As illustrated in FIG. 1B and FIG. 3A, at least a part or whole of the (001) plane of the tetragonal crystal 1 (unit cell uc1) is oriented in the normal direction $D_N$ of the surface of the first electrode layer 7. For example, at least a part or whole of the (001) plane of the tetragonal crystal 1 may be substantially parallel to the surface of the first electrode layer 7. At least a part or whole of the (001) plane of the tetragonal crystal 1 (unit cell uc1) may be oriented in the normal direction dn of the surface of the piezoelectric thin film 3. For example, at least a part or whole of the (001) plane of the tetragonal crystal 1 may be substantially parallel to the surface of the piezoelectric thin film 3.

A tetragonal crystal of a perovskite-type oxide is likely to be polarized in the [001] direction. That is, [001] is an orientation in which a tetragonal crystal of a perovskite-type oxide is likely to be polarized as compared to other crystal orientations. Therefore, the (001) plane of the tetragonal crystal 1 is oriented in the normal direction $D_N$ of the surface of the first electrode layer 7, and thus the piezoelectric thin film 3 can have excellent piezoelectric properties. From the same reason, the piezoelectric thin film 3 may be a ferro-electric material. The "crystalline orientation" described below means that the (001) plane of the tetragonal crystal 1 is oriented in the normal direction $D_N$ of the surface of the first electrode layer 7.

When the piezoelectric thin film 3 has the above-described crystalline orientation, the piezoelectric thin film 3 can have a large piezoelectric performance index ($di_{33,f}/\varepsilon_r\varepsilon_0$). The above-described crystalline orientation is a particular feature of a thin film. A thin film is a crystalline film formed by a vapor deposition method, a solution method, or the like. On the other hand, a bulk of the piezoelectric material having the same composition as that of the piezo-electric thin film 3 is difficult to have the above-described crystalline orientation. This is because the bulk of the piezoelectric material is a sintered material (ceramic material) made from a powder containing essential element of the piezoelectric material, and the structure and orientation of numerous crystals constituting the sintered material are difficult to be controlled.

Figure 4:
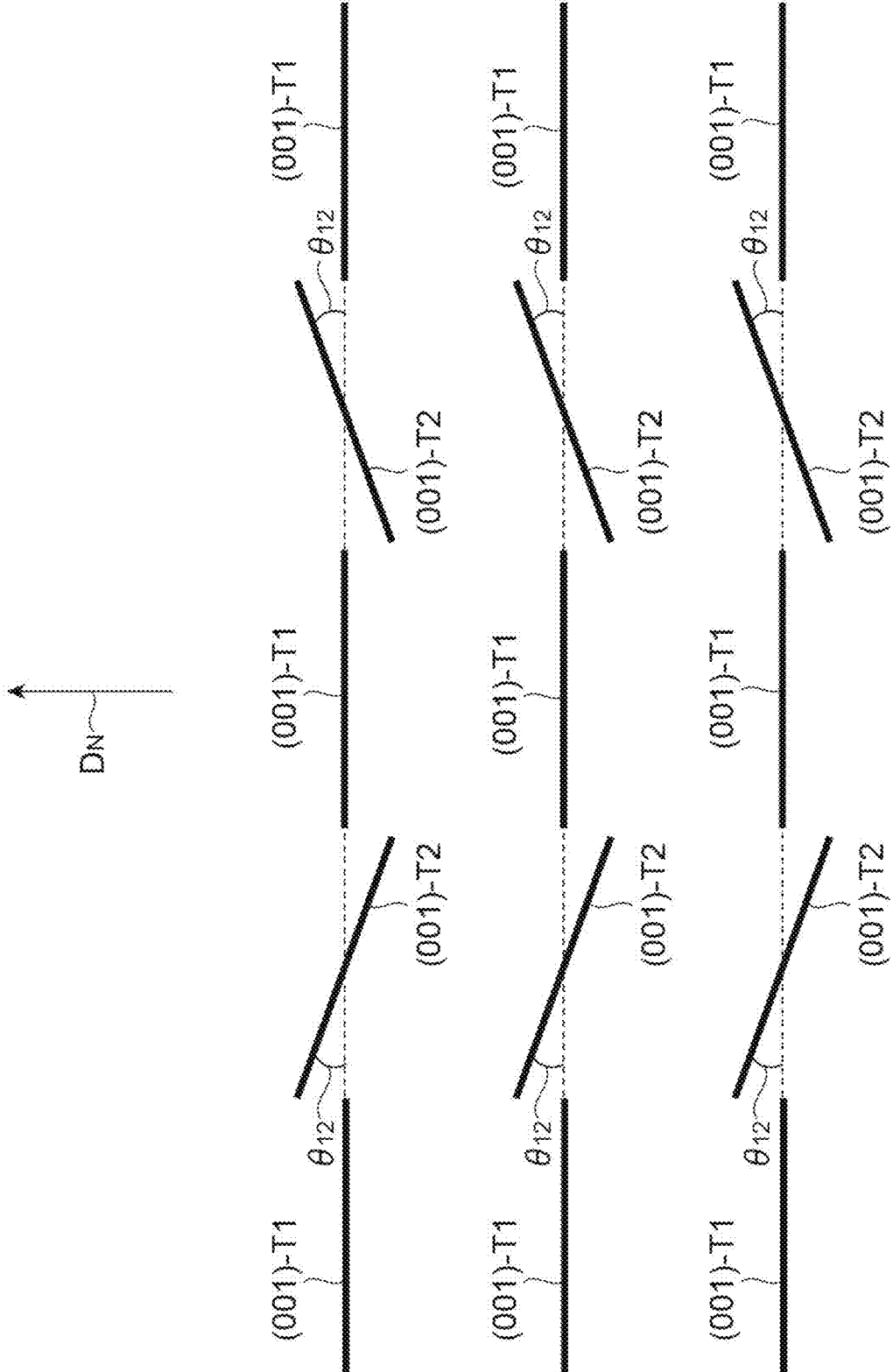
FIG. 4 is a schematic view illustrating (001) planes of a tetragonal crystal 1 in a piezoelectric thin film and (001) planes of a tetragonal crystal 2 in the piezoelectric thin film.

FIG. 4 illustrates orientation directions of the (001) planes of the tetragonal crystal 1 in the piezoelectric thin film 3 and orientation directions of the (001) planes of the tetragonal crystal 2 in the piezoelectric thin film 3. However, the configuration of each of the tetragonal crystal 1 and the tetragonal crystal 2 in the piezoelectric thin film 3 is not limited to that illustrated in FIG. 4. (001)-T1 in FIG. 4 means the (001) plane of the tetragonal crystal 1. (001)-T2 in FIG. 4 means the (001) plane of the tetragonal crystal 2. The (001) plane of the tetragonal crystal 1 in FIG. 4 and the (001) plane of the tetragonal crystal 2 in FIG. 4 are observed in an arbitrary cross-section of the piezoelectric thin film 3 cut parallel to the normal direction $D_N$ of the surface of the first electrode layer 7. As illustrated in FIG. 4, at least a part or whole of the (001) planes of the tetragonal crystal 2 is inclined with respect to the (001) planes of the tetragonal crystal 1. In other words, at least a part or whole of the (001) planes of the tetragonal crystal 2 is not perpendicular to the normal direction $D_N$ of the surface of the first electrode layer 7. In other words, at least a part or whole of the (001) plane of the tetragonal crystal 2 does not have to be parallel to the surface of the first electrode layer 7.

The piezoelectric thin film 3 can have a large piezoelectric performance index ($d_{33,f}/\varepsilon_r\varepsilon_0$) due to the crystalline orientation of the tetragonal crystal 1 and the inclination of the (001) plane of the tetragonal crystal 2. The inventor speculates that the piezoelectric thin film 3 can have a large piezoelectric performance index ($d_{33,f}/\varepsilon_r\varepsilon_0$) by the following mechanism.

Since the (001) plane of the tetragonal crystal 1 is oriented in the normal direction $D_N$ of the surface of the first electrode layer 7 and c1/a1 of the tetragonal crystal 1 is larger than c2/a2 of the tetragonal crystal 2, the piezoelectric thin film 3 is likely to have a low relative permittivity $\varepsilon_r$ derived from the tetragonal crystal 1. Further, since the (001) plane of the tetragonal crystal 2 is inclined with respect to the (001) plane of the tetragonal crystal 1, a rotation of a polarization axis of the tetragonal crystal 2 is likely to occur at the time of electric field application, and the piezoelectric thin film 3 is likely to have a large piezoelectric strain constant $d_{33,f}$ derived from the tetragonal crystal 2. From the above reason, both of a low relative permittivity $\varepsilon_r$ and a large piezoelectric strain constant $d_{33,f}$ are achieved, and thus the piezoelectric thin film 3 can have a larger piezoelectric performance index ($d_{33,f}/\varepsilon_r\varepsilon_0$).

The above mechanism is a hypothesis, and the technical scope of the present invention is not limited by the above mechanism.

For example, the piezoelectric performance index ($d_{33,f}/\varepsilon_r\varepsilon_0$) of the piezoelectric thin film 3 may be from $180\times10^{-3}$ V·m/N to $273\times10^{-3}$ V·m/N or from $200\times10^{-3}$ V·m/N to $246\times10^{-3}$ V·m/N.

For example, the piezoelectric strain constant $d_{33,f}$ of the piezoelectric thin film 3 may be from 62 pC/N to 150 pC/N or from 84 pC/N to 129 pC/N.

For example, the relative permittivity $\varepsilon_r$ (or $\varepsilon_{33}$) of the piezoelectric thin film 3 may be from 39 to 89 or from 41 to 64.

As illustrated in FIG. 4, an absolute value of an angle between the (001) plane of the tetragonal crystal 1 and the (001) plane of the tetragonal crystal 2 is $\theta_{12}$. The $\theta_{12}$ may be from 1.00 to 10.0°. That is, the absolute value $\theta_{12}$ of the angle between (001)-T1 and (001)-T2 in FIG. 4 may be from 1.0° to 10.0°. In a case where $\theta_{12}$ is 1.0° or more, the (001) plane of the tetragonal crystal 2 is sufficiently inclined, and thus the piezoelectric thin film 3 is likely to have a large piezoelectric strain constant $d_{33,f}$. In a case where $\theta_{12}$ is 10° or less, the crystalline orientation of the tetragonal crystal 1 is hardly impaired, and thus the piezoelectric thin film 3 is likely to have a large piezoelectric strain constant $d_{33,f}$.

A spacing of (100) planes of a crystal (lower crystal) contained in the first electrode layer 7 or the second inter-mediate layer 6 is represented as aL. aL is preferably not equal to a1. For example, aL may be larger than a1. aL may be smaller than a1. A lattice mismatch rate $\Delta a$ is defined as $100\times(aL-a1)/a1$. For example, an absolute value of the lattice mismatch rate $\Delta a$ may be from 3.0% to 12.1%. That is, an absolute value of $100\times(aL-a1)/a1$ may be from 3.0 to 12.1. In a case where aL is not equal to a1 and the absolute value of $\Delta a$ is within the above range, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.00 to 10.0°. a1 depends on the composition and crystalline structure of the piezoelectric thin film 3, and aL depends on the composition and crystalline structure of the first electrode layer 7 or the second intermediate layer 6. Therefore, the lattice mismatch rate $\Delta a$ may be controlled by selection and combination of the composition and crystalline structure of each of the piezoelectric thin film 3, the first electrode layer 7, and the second intermediate layer 6.

In contrast with the piezoelectric thin film 3, the strain of the crystalline structure attributable to lattice mismatch is difficult to occur in the bulk of the piezoelectric material. Therefore, most of perovskite-type oxides constituting the bulk of the piezoelectric material are cubic crystals, and there is a tendency that the bulk of the piezoelectric material is more difficult to have piezoelectric properties attributable to the tetragonal crystal of the perovskite-type oxide than the piezoelectric thin film 3.

The spacing, orientation direction of each crystal plane of each of the tetragonal crystal 1 and the tetragonal crystal 2, and $\theta_{12}$ may be specified based on an X-ray diffraction (XRD) patterns of the piezoelectric thin film 3 as measured in an out-of-plane direction and an in-plane direction of the surface of the piezoelectric thin film 3. The crystal plane may be restated as a lattice plane. The spacing and the orientation direction of each crystal plane of each of the tetragonal crystal 1 and the tetragonal crystal 2 may be specified by reciprocal space mapping. That is, the tetragonal crystal 1 and the tetragonal crystal 2 may be detected using a reciprocal space map of the X-ray diffraction pattern of the piezoelectric thin film 3 and may be discriminated from each other. The reciprocal space map may be restated as an intensity distribution map of diffracted X-rays in the reciprocal space. For example, the reciprocal space map may be obtained by measuring intensities of the diffracted the X-rays of the piezoelectric thin film 3 along two or more scan axes selected from the group consisting of an ω axis, a φ axis, a χ axis, a 2θ axis, and a 2θχ axis. For example, the reciprocal space map may be composed of X-ray diffraction patterns measured by ω scanning and 2θ/ω scanning. The reciprocal space map may be a two-dimensional map in a coordination system composed of a horizontal axis and a vertical axis orthogonal to each other. The horizontal axis of the two-dimensional reciprocal space map may represent a value corresponding to the reciprocal of the lattice constant in the in-plane direction of the surface of the piezoelectric thin film 3. For example, the horizontal axis of the reciprocal space map may represent a value corresponding to the reciprocal (that is, 1/a) of a spacing "a" of the (100) planes. The vertical axis of the two-dimensional reciprocal space map may represent a value corresponding to the reciprocal of the lattice constant in the normal direction dn of the surface of the piezoelectric thin film 3. For example, the vertical axis of the reciprocal space map may represent a value corresponding to the reciprocal (that is, 1/c) of a spacing "c" of the (001) planes. The reciprocal space map contains a plurality of spots. One spot corresponds to the diffracted X-rays derived from one crystal plane of a crystal of any one of the tetragonal crystal 1 and the tetragonal crystal 2. The spacing and orientation direction of one crystal plane of a crystal of any one of the tetragonal crystal 1 and the tetragonal crystal 2 may be specified from the coordinate of one spot in the reciprocal space map.

Figures 6A, 6B:
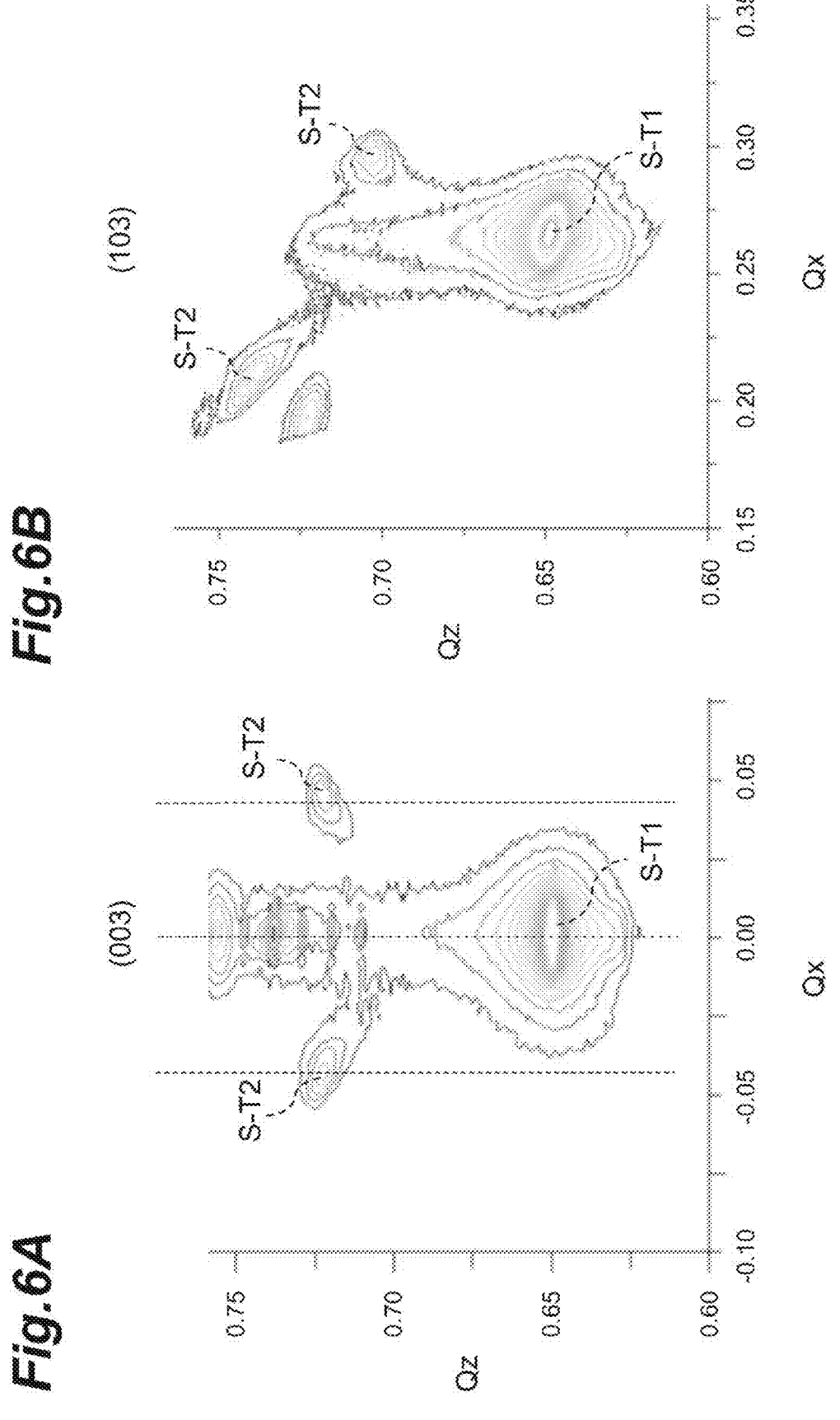
FIG. 6A and FIG. 6B show reciprocal space maps of diffracted X-rays derived from a piezoelectric thin film contained in a piezoelectric thin film element of Example 1 of the present invention.

FIG. 6A and FIG. 6B show examples of the reciprocal space maps of the piezoelectric thin film 3. S-T1 in FIG. 6A is a spot corresponding to a (003) plane of the tetragonal crystal 1. S-T2 in FIG. 6A is a spot corresponding to a(003) plane of the tetragonal crystal 2. S-T1 in FIG. 6B is a spot corresponding to a (103) plane of the tetragonal crystal 1. S-T2 in FIG. 6B is a spot corresponding to a (103) plane of the tetragonal crystal 2. A difference between the coordinate of S-T1 and the coordinate of S-T2 indicates an inclination of the (003) plane (and the (001) plane) of the tetragonal crystal 2 with respect to the (003) plane (and the (001) plane) of the tetragonal crystal 1. That is, the difference between the coordinate of S-T1 and the coordinate of S-T2 indicates $\theta_{12}$.

c1/a1 of the tetragonal crystal 1 may be from 1.120 to 1.270 or from 1.120 to 1.267. In a case where c1/a1 is 1.120 or more, the piezoelectric thin film 3 is likely to have a low relative permittivity derived from the tetragonal crystal 1, and thus the piezoelectric performance index of the piezoelectric thin film 3 is likely to increase. In a case where c1/a1 is 1.270 or less, the polarization reversal of the tetragonal crystal 1 is likely to occur, and thus the piezoelectric performance index of the piezoelectric thin film 3 is likely to increase. For example, c1 may be from 4.420 Å to 4.700 Å. For example, a1 may be from 3.700 Å to 3.940 Å.

c2/a2 may be from 1.010 to 1.115 or from 1.014 to 1.111. In a case where c2/a2 is within the above range, the polarization reversal of the tetragonal crystal 2 is likely to occur, the piezoelectric thin film 3 is likely to have a large $d_{33,f}$ derived from the tetragonal crystal 2, and thus the piezoelectric thin film 3 is likely to have a large piezoelectric performance index. In a case where c2/a2 is out of the above range, the relative permittivity of the tetragonal crystal 2 tends to be excessively high, or the piezoelectric properties of the tetragonal crystal 2 itself tend to deteriorate. For example, c2 may be from 4.000 Å to 4.215 Å. For example, a2 may be from 3.781 Å to 3.961 Å or from 3.843 Å to 3.961 Å.

The piezoelectric thin film 3 may further contain a trace amount of a crystal other than the tetragonal crystal 1 and the tetragonal crystal 2.

For example, the piezoelectric thin film 3 may further contain a third tetragonal crystal as a tetragonal crystal of a perovskite-type oxide. A (001) plane of the third tetragonal crystal may be oriented in the normal direction $D_N$ of the surface of the first electrode layer 7. A spacing of (001) planes of the third tetragonal crystal is c3. A spacing of (100) planes of the third tetragonal crystal is a3. c3/a3 may be smaller than c1/a1. c3/a3 of the third tetragonal crystal may be from 1.010 to 1.115. The composition of the third tetragonal crystal may be the same as the composition of the tetragonal crystal 1 or the tetragonal crystal 2. The composition of the third tetragonal crystal may be different from the composition of the tetragonal crystal 1 or the tetragonal crystal 2. The third tetragonal crystal may be the same as the tetragonal crystal 2 except for a direction in which the (001) plane is oriented.

For example, the piezoelectric thin film 3 may further contain a rhombohedral crystal of a perovskite-type oxide. A (001) plane of the rhombohedral crystal may be oriented in the normal direction $D_N$ of the surface of the first electrode layer 7. A spacing a4 of (001) planes of the rhombohedral crystal may be substantially the same as the spacing c3 of the (001) planes of the third tetragonal crystal. The composition of the rhombohedral crystal may be the same as the composition of the tetragonal crystal 1, the tetragonal crystal 2, or the third tetragonal crystal. The composition of the rhombohedral crystal may be different from the composition of the tetragonal crystal 1, the tetragonal crystal 2, or the third tetragonal crystal.

A peak intensity (maximum intensity) of diffracted X-rays of the (001) plane of the tetragonal crystal 1 is $I_1$. A peak intensity (maximum intensity) of diffracted X-rays of the (001) plane of the tetragonal crystal 2 is $I_2$. $100 \times I_2/(I_1+I_2)$ may be from 0.30 to 10.0 or from 0.40 to 9.80. In a case where $100 \times I_2/(I_1+I_2)$ is within the above ranges, both of a low relative permittivity ($\varepsilon_r$) derived from the tetragonal crystal 1 and a large piezoelectric strain constant ($d_{33,f}$) derived from the tetragonal crystal 2 are easily compatible. As a result, the piezoelectric thin film 3 is likely to have a large piezoelectric performance index. A unit of each of $I_1$ and $I_2$ may be, for example, cps (counts per second). $I_1$ and $I_2$ may be specified by out-of-plane measurement in the surface of the piezoelectric thin film 3. Measurement conditions of each of $I_1$ and $I_2$ may be set such that each of $I_1$ and $I_2$ is higher than the background intensity by at least triple digits or more.

$I_1$ may be proportional to the total area of the (001) planes of the tetragonal crystal 1, and $I_2$ may be proportional to the total area of the (001) planes of the tetragonal crystal 2. In other words, $I_1$ may be proportional to the amount of the tetragonal crystal 1 contained in the piezoelectric thin film 3, and $I_2$ may be proportional to the amount of the tetragonal crystal 2 contained in the piezoelectric thin film 3. Therefore, $I_2/(I_1+I_2)$ may be an abundance ratio of the tetragonal crystal 2 with respect to the total amount of the tetragonal crystal 1 and the tetragonal crystal 2. That is, the abundance ratio $I_2/(I_1+I_2)$ of the tetragonal crystal 2 with respect to the total amount of the tetragonal crystal 1 and the tetragonal crystal 2 may be 0.30% or more and less than 10.0%.

The degree of orientation of each of the (001) plane of the tetragonal crystal 1 and the (001) plane of the tetragonal crystal 2 may be quantified by the orientation degree. As the orientation degree of each of the (001) plane of the tetragonal crystal 1 and the (001) plane of the tetragonal crystal 2 is larger, the piezoelectric thin film 3 is likely to have a large piezoelectric performance index. The orientation degree of each crystal plane may be calculated based on a peak of diffracted X-rays derived from each crystal plane. The peak of the diffracted X-rays derived from each crystal plane may be measured by out-of-plane measurement in the surface of the piezoelectric thin film 3.

The orientation degree of the (001) plane of the tetragonal crystal 1 may be represented as $100 \times I_1/\Sigma I_{1(hkl)}$. $\Sigma I_{1(hkl)}$ is the sum of peak intensities of diffracted X-rays derived from respective crystal planes of the tetragonal crystal 1 as measured in the out-of-plane direction of the surface of the piezoelectric thin film 3. $\Sigma I_{1(hkl)}$ may be, for example, $I_{1(001)}+I_{1(110)}+I_{1(111)}$. $I_{1(001)}$ is $I_1$ described above. That is, $I_{1(001)}$ is a peak intensity (maximum intensity) of diffracted X-rays of the (001) plane of the tetragonal crystal 1 as measured in the out-of-plane direction of the surface of the piezoelectric thin film 3. $I_{1(110)}$ is a peak intensity (maximum intensity) of diffracted X-rays of a (110) plane of the tetragonal crystal 1 as measured in the out-of-plane direction of the surface of the piezoelectric thin film 3. I(m) is a peak intensity (maximum intensity) of diffracted X-rays of a (111) plane of the tetragonal crystal 1 as measured in the out-of-plane direction of the surface of the piezoelectric thin film 3.

The orientation degree of the (001) plane of the tetragonal crystal 2 may be represented as $100 \times I_2/\Sigma I_{2(hkl)}$. $I_{1(001)}$ is the sum of peak intensities of diffracted X-rays derived from respective crystal planes of the tetragonal crystal 2 as measured in the out-of-plane direction of the surface of the piezoelectric thin film 3. $\Sigma I_{2(hkl)}$ may be, for example, $I_{2(001)}+I_{2(110)}+I_{2(111)}$. $I_{2(001)}$ is $I_2$ described above. That is, $I_{2(001)}$ is a peak intensity (maximum intensity) of diffracted X-rays of the (001) plane of the tetragonal crystal 2 as measured in the out-of-plane direction of the surface of the piezoelectric thin film 3. $I_{2(110)}$ is a peak intensity (maximum intensity) of diffracted X-rays of a (110) plane of the tetragonal crystal 2 as measured in the out-of-plane direction of the surface of the piezoelectric thin film 3. $I_{2(111)}$ is a peak intensity (maximum intensity) of diffracted X-rays of a (111) plane of the tetragonal crystal 2 as measured in the out-of-plane direction of the surface of the piezoelectric thin film 3.

The degree of orientation of each of the (001) plane of the tetragonal crystal 1 and the (001) plane of the tetragonal crystal 2 may be quantified by an orientation degree F. based on a Lotgering method. Even in the case of calculating the orientation degree by any of the above-described methods, the orientation degree of each of the (001) plane of the tetragonal crystal 1 and the (001) plane of the tetragonal crystal 2 may be from 70% to 100%, preferably from 80% to 100%, and more preferably from 90% to 100%. In other words, the (001) plane of the tetragonal crystal 1 may be oriented in the normal direction $D_N$ of the surface of the first electrode layer 7 in preference to the other crystal planes of the tetragonal crystal 1. The (001) plane of the tetragonal crystal 2 may be oriented in the out-of-plane direction of the surface of the piezoelectric thin film 3 in preference to the other crystal planes of the tetragonal crystal 2.

The tetragonal crystal 1 may be represented by Chemical Formula 1 below. Chemical Formula 1 below is substantially the same as Chemical Formula 1a below.

$$x1(Bi_{1-\alpha}E^A{}_\alpha)(E^{B1}{}_{1-\beta}E^{B2}{}_\beta)O_3{-}y1BiFeO_3 \qquad (1)$$

$$(Bi_{x1(1-\alpha)+y1}E^A{}_{x1\alpha})(E^{B1}{}_{x1(1-\beta)}E^{B2}{}_{x1\beta}Fe_{y1})O_{3\pm\delta} \qquad (1a)$$

x1+y1 in Chemical Formula 1 above may be 1.00. $E^A$ in Chemical Formula 1 above may be at least one element selected from the group consisting of Na, K, Ag, and Ba. $E^{B1}$ in Chemical Formula 1 above may be at least one element selected from the group consisting of Mg, Al, Zr, Ti, Ni, and Zn. $E^{B2}$ in Chemical Formula 1 above may be at least one element selected from the group consisting of Mg, Al, Zr, Ti, Ni, and Zn. $E^{B1}$ and $E^{B2}$ are different from each other. A unit of each of $\alpha$, $\beta$, x1, and y1 may be mol.

$Bi_{x1(1-\alpha)+y1}E^A{}_{x1\alpha}$ in Chemical Formula 1a above corresponds to elements located in the A site of the perovskite structure. $E^{B1}{}_{x1(1-\beta)}E^{B2}{}_{x1\beta}Fe_{y1}$ in Chemical Formula 1a above corresponds to elements located in the B site of the perovskite structure.

x1 in Chemical Formula 1 above may be from 0.05 to 0.90. In a case where x1 is from 0.05 to 0.90, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°.

y1 in Chemical Formula 1 above may be from 0.10 to 0.95. In a case where y1 is from 0.10 to 0.95, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°.

$\alpha$ in Chemical Formula 1 above may be from 0.00 to 1.00. $\alpha$ may be 0.00 or 0.50. $\beta$ in Chemical Formula 1 above may be from 0.00 to 1.00. $\beta$ may be 0.00 or 0.50.

$\delta$ in Chemical Formula 1a above may be 0 or more. $\delta$ may be a value other than 0 as long as the crystalline structure (perovskite structure) of the tetragonal crystal 1 is maintained. For example, $\delta$ may be more than 0 and 1.0 or less. For example, $\delta$ may be calculated from the valence of each ion located in each of the A site and the B site in the tetragonal crystal 1. The valence of each ion may be measured by an X-ray photoelectron spectroscopy (XPS) method.

The total value of mole numbers of Bi and $E^A$ contained in the tetragonal crystal 1 may be represented as $[A]_1$, the total value of mole numbers of $E^{B1}$, $E^{B2}$, and Fe contained in the tetragonal crystal 1 may be represented as $[B]_1$, and $[A]_1/[B]_1$, may be 1.0. $[A]_1/[B]_1$ may be a value other than 1.0 as long as the crystalline structure (perovskite structure) of the tetragonal crystal 1 is maintained. That is, $[A]_1/[B]_1$ may be less than 1.0, or $[A]_1/[B]_1$, may be larger than 1.0.

The tetragonal crystal 2 may be represented by Chemical Formula 2 below. Chemical Formula 2 below is substantially the same as Chemical Formula 2a below.

$$x2(Bi_{1-\alpha}E^A{}_\alpha)(E^{B1}{}_{1-\beta}E^{B2}{}_\beta)O_3 - y2BiFeO_3 \qquad (2)$$

$$(Bi_{x2(1-\alpha)+y2}E^A{}_{x2\alpha})(E^{B1}{}_{x2(1-\beta)}E^{B2}{}_{x2\beta}Fe_{y2})O_{3\pm\delta} \qquad (2a)$$

x2+y2 in Chemical Formula 2 above may be 1.00. $E^A$ in Chemical Formula 2 above may be at least one element selected from the group consisting of Na, K, Ag, and Ba. $E^{B1}$ in Chemical Formula 2 above may be at least one element selected from the group consisting of Mg, Al, Zr, Ti, Ni, and Zn. $E^{B2}$ in Chemical Formula 2 above may be at least one element selected from the group consisting of Mg, Al, Zr, Ti, Ni, and Zn. $E^{B1}$ and $E^{B2}$ are different from each other. A unit of each of $\alpha$, $\beta$, x2, and y2 may be mol.

$E^A$ in Chemical Formula 2 above may be the same as or different from $E^A$ in Chemical Formula 1 above. $E^{B1}$ in Chemical Formula 2 above may be the same as or different from $E^{B1}$ in Chemical Formula 1 above. $E^{B2}$ in Chemical Formula 2 above may be the same as or different from $E^{B2}$ in Chemical Formula 1 above. x2 in Chemical Formula 2 above may be the same as or different from x1 in Chemical Formula 1 above. y2 in Chemical Formula 2 above may be the same as or different from y1 in Chemical Formula 1 above. $\alpha$ in Chemical Formula 2 above may be the same as or different from $\alpha$ in Chemical Formula 1 above. $\beta$ in Chemical Formula 2 above may be the same as or different from $\beta$ in Chemical Formula 1 above.

$Bi_{x2(1-\alpha)+y2}E^A{}_{x2\alpha}$ in Chemical Formula 2a above corresponds to elements located in the A site of the perovskite structure. $E^{B1}{}_{x2(1-\beta)}E^{B2}{}_{x2\beta}Fe_{y2}$ in Chemical Formula 2a above corresponds to elements located in the B site of the perovskite structure.

x2 in Chemical Formula 2 above may be from 0.05 to 0.90. In a case where x2 is from 0.05 to 0.90, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°.

y2 in Chemical Formula 2 above may be from 0.10 to 0.95. In a case where y2 is from 0.10 to 0.95, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°.

$\alpha$ in Chemical Formula 2 above may be from 0.00 to 1.00. $\alpha$ may be 0.00 or 0.50. $\beta$ in Chemical Formula 2 above may be from 0.00 to 1.00. $\beta$ may be 0.00 or 0.50.

$\delta$ in Chemical Formula 2a above may be 0 or more. $\delta$ may be a value other than 0 as long as the crystalline structure (perovskite structure) of the tetragonal crystal 2 is maintained. For example, $\delta$ may be more than 0 and 1.0 or less. For example, $\delta$ may be calculated from the valence of each ion located in each of the A site and the B site in the tetragonal crystal 2. The valence of each ion may be measured by an X-ray photoelectron spectroscopy (XPS) method.

The total value of the number of moles of Bi and $E^A$ contained in the tetragonal crystal 2 may be represented as $[A]_2$, the total value of the number of moles of $E^{B1}$, $E^{B2}$, and Fe contained in the tetragonal crystal 2 may be represented as $[B]_2$, and $[A]_2/[B]_2$ may be 1.0. $[A]_2/[B]_2$ may be a value other than 1.0 as long as the crystalline structure (perovskite structure) of the tetragonal crystal 2 is maintained. That is, $[A]_2/[B]_2$ may be less than 1.0, or $[A]_2/[B]_2$ may be larger than 1.0.

The piezoelectric thin film 3 may be an epitaxial film. That is, the piezoelectric thin film 3 may be formed by epitaxial growth. The piezoelectric thin film 3 excellent in anisotropy and crystalline orientation is easily formed by epitaxial growth.

For example, the thickness of the piezoelectric thin film 3 in the normal direction $D_N$ of the surface of the first electrode layer 7 may be from 500 nm to 10000 nm. The thickness of the piezoelectric thin film 3 may be measured with a scanning electron microscope (SEM) in the cross-section of the piezoelectric thin film 3 parallel to the normal direction $D_N$ of the surface of the first electrode layer 7. The crystalline substrate 8, the first intermediate layer 5, the first electrode layer 7, the second intermediate layer 6, the piezoelectric thin film 3, and the second electrode layer 4 may be discriminated from one another based on a difference in brightness in a backscattered electron image of the cross-section of the piezoelectric thin film element 10. The thickness of each of the crystalline substrate 8, the first intermediate layer 5, the first electrode layer 7, the second intermediate layer 6, and the second electrode layer 4 may be measured by the same method for the thickness of the piezoelectric thin film 3.

For example, the area of the surface of the piezoelectric thin film 3 may be from 1 $\mu m^2$ to 500 $mm^2$. The area of each of the crystalline substrate 8, the first intermediate layer 5, the first electrode layer 7, the second intermediate layer 6, and the second electrode layer 4 may be the same as the area of the piezoelectric thin film 3.

The composition of the piezoelectric thin film 3 may be analyzed, for example, by at least one method selected from the group consisting of an X-ray fluorescence analysis (XRF) method, an inductively coupled plasma (ICP) emission spectroscopy, and an X-ray photoelectron spectroscopy (XPS) method. The piezoelectric thin film 3 may be cut in a direction substantially parallel to the normal direction $D_N$ of the surface of the first electrode layer 7, and the composition of each of the tetragonal crystal 1 and the tetragonal crystal 2 may be specified by analysis of the cross-section of the piezoelectric thin film 3. In the analysis of the cross-section of the piezoelectric thin film 3, an energy dispersive X-ray (EDX) analyzer included in a scanning electron microscope (SEM) or a scanning transmission electron microscope (STEM) may be used. The crystalline structure and the crystalline orientation of the piezoelectric thin film 3 may be a crystalline structure and a crystalline orientation at normal temperature.

The piezoelectric thin film 3 is formed directly on the surface of the first electrode layer 7 or the second intermediate layer 6 by the following film formation step. In the film formation step, the piezoelectric thin film 3 is formed by a pulsed-laser deposition (PLD) method using a target. The target is a raw material for the piezoelectric thin film 3. The target may be composed of all elements that are common to all elements constituting the piezoelectric thin film 3. The composition of the target may be adjusted so that the molar ratio of each element constituting the target is substantially consistent with the molar ratio of each element constituting the piezoelectric thin film 3. For example, the molar ratio of each element constituting the target may be substantially consistent with the molar ratio of each element constituting Chemical Formula 1 above or Chemical Formula 2 above.

In the PLD method, the target is irradiated with pulse laser light so that the element constituting the target is converted to a plasma state to evaporate. According to the PLD method, each element constituting the target can be uniformly converted to a plasma state in a moment. As a result, the molar ratio of each element in the piezoelectric thin film 3 is likely to be substantially consistent with the molar ratio of each element in each target, and the segregation of the element in the piezoelectric thin film 3 is easily suppressed. Furthermore, according to the PLD method, the piezoelectric thin film 3 is easily grown epitaxially, and thus the piezoelectric thin film 3 that is dense at an atomic level is easily formed. For example, the pulse laser light may be excimer laser such as KrF laser having a wavelength of 248 nm.

In the PLD method, a fluence of the pulse laser light is controlled. The fluence is restated as an energy density (unit: $mJ/cm^2$) of the pulse laser light with which the target is irradiated. The fluence of the pulse laser light may be restated as an energy of the pulse laser light per unit area of the surface of the target. The fluence of the pulse laser light may be from 8 $mJ/cm^2$ to 12 $mJ/cm^2$. In a case where the fluence of the pulse laser light is from 8 $mJ/cm^2$ to 12 $mJ/cm^2$, the epitaxial growth rate of the piezoelectric thin film 3 is moderately suppressed, and thus the lattice mismatch between the piezoelectric thin film 3 and the first electrode layer 7 or the lattice mismatch between the piezoelectric thin film 3 and the second intermediate layer 6 moderately affects the growth of the piezoelectric thin film 3. As a result, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°. In a case where the fluence of the pulse laser light is less than 8 $mJ/cm^2$, the piezoelectric thin film 3 is difficult to have crystallinity, and the (001) plane of the tetragonal crystal 1 is difficult to be oriented in the normal direction $D_N$ of the surface of the first electrode layer 7. In a case where the fluence of the pulse laser light is more than 12 $mJ/cm^2$, the (001) plane of the tetragonal crystal 2 is difficult to be inclined with respect to the (001) plane of the tetragonal crystal 1. That is, in a case where the fluence of the pulse laser light is more than 12 $mJ/cm^2$, the epitaxial growth rate of the piezoelectric thin film 3 is excessively fast, and thus the lattice mismatch is difficult to affect the growth of the piezoelectric thin film 3. As a result, not only the (001) plane of the tetragonal crystal 1 but also the (001) plane of the tetragonal crystal 2 are likely to be oriented in the normal direction $D_N$ of the surface of the first electrode layer 7.

In the PLD method, the growth rate of the piezoelectric thin film 3 and the anisotropy and orientation of each of the tetragonal crystal 1 and the tetragonal crystal 2 may be controlled by changing the number of pulses (repetition frequency) of pulse laser light. With a decrease in repetition frequency of pulse laser light, the growth rate of the piezoelectric thin film 3 decreases, and the anisotropy of each of the tetragonal crystal 1 and the tetragonal crystal 2 and the orientation of the crystal plane of each of the tetragonal crystal 1 and the tetragonal crystal 2 are enhanced. For example, a repetition frequency f of pulse laser light in the film formation step may be about 10 Hz. In a case where the repetition frequency f of the pulse laser light is 10 Hz, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°.

The target that is a raw material for the piezoelectric thin film 3 may be produced by the following method.

As a starting material for the target, for example, an oxide of each of Bi, $E^A$, $E^B$, and Fe may be used. As the starting material, instead of an oxide, a substance, which becomes an oxide by sintering, such as carbonate or oxalate may be used. After these starting materials are sufficiently dried at 100° C. or higher, each starting material is weighed so that the molar ratio of each of Bi, $E^A$, $E^B$, and Fe is consistent with the molar ratio of each element in the piezoelectric thin film 3. In the film formation step, Bi in the target is likely to volatilize as compared to other elements. Therefore, the molar ratio of Bi in the target may be adjusted to a value higher than the molar ratio of Bi in the piezoelectric thin film 3. In the case of using a raw material containing K as $E^A$, in the film formation step, K in the target is likely to volatilize as compared to other elements. Therefore, the molar ratio of K in the target may be adjusted to a value higher than the molar ratio of K in the piezoelectric thin film 3.

The weighed starting materials are sufficiently mixed in an organic solvent or water. The mixing time may be from 5 hours to 20 hours. The mixing means may be, for example, a ball mill. The starting materials obtained after mixing is sufficiently dried, and then the starting materials are molded with a pressing machine. The molded starting materials are calcined to obtain a calcined product. The calcining temperature may be from 750° C. to 900° C. The calcining time may be from 1 hour to 3 hours. The calcined product is pulverized in an organic solvent or water. The pulverization time may be from 5 hours to 30 hours. The pulverization means may be a ball mill. After the calcined product thus pulverized is dried, a powder of the calcined product is obtained by granulating the calcined product added with a binder solution. The powder of the calcined product is subjected to press molding to obtain a block-shaped molded body.

The binder in the molded body volatilizes by heating the block-shaped molded body. The heating temperature may be from 400° C. to 800° C. The heating time may be from 2 hours to 4 hours.

After the volatilization of the binder, the molded body is sintered. The sintering temperature may be from 800° C. to 1100° C. The sintering time may be from 2 hours to 4 hours. The temperature increasing rate and temperature decreasing rate of the molded body in the sintering process may be, for example, from 50° C./hr to 300° C./hr.

The target is produced by the above steps. The average grain size of crystal grains of the perovskite-type oxide contained in the target may be, for example, from 1 μm to 20 μm.

In the film formation step, elements constituting the target are evaporated in a vacuum atmosphere by the PLD method. The evaporated elements are attached and deposited to the surface of the first electrode layer 7 or the second intermediate layer 6 to form the piezoelectric thin film 3. In the film formation step, the piezoelectric thin film may be formed in a vacuum chamber while the inside of the vacuum chamber is heated. For example, the temperature (film-forming temperature) inside the vacuum chamber may be from 450° C. to 600° C. As the film-forming temperature increases, cleanliness of the surface of the first electrode layer 7 or the second intermediate layer 6 is improved, and thus the crystallinity of the piezoelectric thin film 3 is likely to be improved. In a case where the film-forming temperature is excessively high, the piezoelectric thin film 3 is difficult to have crystallinity. Furthermore, in a case where the film-forming temperature is excessively high, each element constituting the piezoelectric thin film 3 is excessively reduced, and thus the piezoelectric thin film 3 having a desired composition is difficult to be obtained. Further, in a case where the film-forming temperature is excessively high, Bi or K is likely to be desorbed from the piezoelectric thin film 3, and thus the composition of the piezoelectric thin film 3 is difficult to be controlled.

For example, the oxygen partial pressure in the vacuum chamber may be, for example, from 0.1 Pa to 3.0 Pa. In a case where the oxygen partial pressure is excessively low, each element derived from the target is difficult to be sufficiently oxidized, and thus the perovskite-type oxide is difficult to be formed, so that the crystallinity of the piezoelectric thin film 3 is likely to deteriorate. In a case where the oxygen partial pressure is excessively high, the growth rate of the piezoelectric thin film 3 is likely to decrease, and the crystallinity of the piezoelectric thin film 3 is likely to deteriorate.

In the film formation step, in addition to the fluence and the repetition frequency of pulse laser light, the number of times of irradiation of the target with pulse laser light (film formation time) may be controlled. With an increase in the number of times of irradiation of the target with pulse laser light (film formation time), the thickness of the piezoelectric thin film 3 tends to increase. In the film formation step, a distance between the surface of the first electrode layer 7 or the second intermediate layer 6 and the target may be controlled. With a decrease in distance between the surface of the first electrode layer 7 or the second intermediate layer 6 and the target, the thickness and growth rate of the piezoelectric thin film 3 tend to increase.

After the piezoelectric thin film 3 is formed by the film formation step, an annealing treatment (heating treatment) of the piezoelectric thin film 3 in the vacuum chamber may be performed. The temperature (annealing temperature) of the piezoelectric thin film 3 in the annealing treatment may be, for example, from 300° C. to 1000° C. The piezoelectric properties of the piezoelectric thin film 3 tend to be further improved by the annealing treatment of the piezoelectric thin film 3. The piezoelectric properties of the piezoelectric thin film 3 are easily improved by the annealing treatment particularly at a temperature from 850° C. to 1000° C. However, the annealing treatment is not essential.

In the formation process of the piezoelectric thin film 3 described above and a temperature decreasing process subsequent thereto, the compressive stress due to a change in temperature may be generated in the piezoelectric thin film 3. The piezoelectric thin film 3 is compressed by the compressive stress in directions (a-axis direction and b-axis direction) substantially parallel to the surface of the first electrode layer 7. As a result, the tetragonal crystal 1 and the tetragonal crystal 2 are likely to be formed.

The crystalline substrate 8 may be a single-crystal substrate. For example, the crystalline substrate 8 may be a substrate consisting of a single crystal of Si or a substrate consisting of a single crystal of a compound semiconductor such as GaAs. The crystalline substrate 8 may be a substrate consisting of a single crystal of an oxide. The single crystal of an oxide may be, for example, MgO or a perovskite-type oxide (for example, $SrTiO_3$). For example, the thickness of the crystalline substrate 8 may be from 10 μm to 1000 μm. In a case where the crystalline substrate 8 has electrical conductivity, the crystalline substrate 8 functions as an electrode layer (first electrode layer 7), and thus the first electrode layer 7 does not have to be provided. For example, the crystalline substrate 8 having electrical conductivity may be a single crystal of $SrTiO_3$ doped with niobium (Nb). A SOT (Silicon-on-Insulator) substrate may be used as the crystalline substrate 8.

A crystal orientation of the crystalline substrate 8 may be equal to the normal direction of the surface of the crystalline substrate 8. That is, the surface of the crystalline substrate 8 may be parallel to a crystal plane of the crystalline substrate 8. The normal direction of the surface of the crystalline substrate 8 is substantially parallel to the normal direction $D_N$ of the surface of the first electrode layer 7. The crystalline substrate 8 may be a uniaxially oriented substrate. For example, a (100) plane of the crystalline substrate 8 such as Si may be parallel to the surface of the crystalline substrate 8. That is, a [100] direction of the crystalline substrate 8 such as Si may be parallel to the normal direction of the surface of the crystalline substrate 8.

In a case where the (100) plane of the crystalline substrate 8 such as Si is parallel to the surface of the crystalline substrate 8, the (001) plane of the tetragonal crystal 1 is likely to be oriented in the normal direction $D_N$ of the surface of the first electrode layer 7.

As described above, the first intermediate layer 5 may be disposed between the crystalline substrate 8 and the first electrode layer 7. The first intermediate layer 5 may contain, for example, at least one selected from the group consisting of titanium(Ti), chromium (Cr), titanium oxide ($TiO_2$), silicon oxide ($SiO_2$), zirconium oxide ($ZrO_2$), and yttrium oxide ($Y_2O_3$). The first electrode layer 7 is easily in close contact with the crystalline substrate 8 with the first intermediate layer 5 interposed therebetween. The first intermediate layer 5 may be crystalline. A crystal plane of the first intermediate layer 5 may be oriented in the normal direction of the surface of the crystalline substrate 8. Both of the crystal plane of the crystalline substrate 8 and the crystal plane of the first intermediate layer 5 may be oriented in the normal direction of the surface of the crystalline substrate 8. The formation method of the first intermediate layer 5 may be a sputtering method, a vacuum deposition method, a printing method, a spin coat method, or a sol-gel method.

The first intermediate layer 5 may contain $ZrO_2$ and an oxide of a rare-earth element. When the first intermediate layer 5 contains $ZrO_2$ and an oxide of a rare-earth element, the first electrode layer 7 consisting of a platinum crystal is likely to be formed on the surface of the first intermediate layer 5, a (002) plane of the platinum crystal is likely to be oriented in the normal direction $D_N$ of the surface of the first electrode layer 7, and a (200) plane of the platinum crystal is likely to be oriented in the in-plane direction of the surface of the first electrode layer 7. The rare-earth element may be at least one selected from the group consisting of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

The first intermediate layer 5 may contain $ZrO_2$ and $Y_2O_3$. For example, the first intermediate layer 5 may consist of yttria-stabilized zirconia ($ZrO_2$ added with $Y_2O_3$). The first intermediate layer 5 may have a first layer consisting of $ZrO_2$ and a second layer consisting of $Y_2O_3$. The first layer consisting of $ZrO_2$ may be directly laminated on the surface of the crystalline substrate 8. The second layer consisting of $Y_2O_3$ may be directly laminated on the surface of the first layer. The first electrode layer 7 may be directly laminated on the surface of the second layer consisting of $Y_2O_3$. In a case where the first intermediate layer 5 contains $ZrO_2$ and $Y_2O_3$, the piezoelectric thin film 3 is likely to be epitaxially grown, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°. Furthermore, in a case where the first intermediate layer 5 contains $ZrO_2$ and $Y_2O_3$, the first electrode layer 7 consisting of a platinum crystal is likely to be formed on the surface of the first intermediate layer 5, the (002) plane of the platinum crystal is likely to be oriented in the normal direction $D_N$ of the surface of the first electrode layer 7, and the (200) plane of the platinum crystal is likely to be oriented in the in-plane direction of the surface of the first electrode layer 7.

The first electrode layer 7 may consist of, for example, at least one metal selected from the group consisting of platinum (Pt), palladium (Pd), rhodium(Rh), gold (Au), ruthenium(Ru), iridium (Ir), molybdenum (Mo), titanium (Ti), tantalum (Ta), and nickel (Ni). The first electrode layer 7 may consist of, for example, a conductive metal oxide such as strontium ruthenate ($SrRuO_3$), lanthanum nickel oxide ($LaNiO_3$), or lanthanum strontium cobalt oxide ($(La,Sr)CoO_3$). The first electrode layer 7 may be crystalline. A crystal plane of the first electrode layer 7 may be oriented in the normal direction $D_N$ of the surface of the first electrode layer 7. That is, the crystal plane of the first electrode layer 7 may be substantially parallel to the surface of the first electrode layer 7. The crystal plane of the first electrode layer 7 oriented in the normal direction $D_N$ of the surface of the first electrode layer 7 may be substantially parallel to the (001) plane of the tetragonal crystal 1. The thickness of the first electrode layer 7 may be, for example, from 1 nm to 1.0 µm. The formation method of the first electrode layer 7 may be a sputtering method, a vacuum deposition method, a printing method, a spin coat method, or a sol-gel method. In the case of a printing method, a spin coat method, or a sol-gel method, the heating treatment (annealing) of the first electrode layer 7 may be performed in order to enhance the crystallinity of the first electrode layer 7.

The first electrode layer 7 may contain a platinum crystal. The first electrode layer 7 may consist of a platinum crystal. The platinum crystal is a cubic crystal having a face-centered cubic lattice structure (fcc structure). The (002) plane of the platinum crystal may be oriented in the normal direction $D_N$ of the surface of the first electrode layer 7, and the (200) plane of the platinum crystal may be oriented in the in-plane direction of the surface of the first electrode layer 7. In other words, the (002) plane of the platinum crystal may be substantially parallel to the surface of the first electrode layer 7, and the (200) plane of the platinum crystal may be substantially perpendicular to the surface of the first electrode layer 7. In a case where the (002) plane and the (200) plane of the platinum crystal constituting the first electrode layer 7 have the above-described orientation, the piezoelectric thin film 3 is likely to be epitaxially grown, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°.

As described above, the second intermediate layer 6 may be disposed between the first electrode layer 7 and the piezoelectric thin film 3. The second intermediate layer 6 may contain, for example, at least one compound selected from the group consisting of $BaTiO_3$, $SrRuO_3$, $LaNiO_3$, and $(La,Sr)CoO_3$. $(La,Sr)CoO_3$ may be, for example, $La_{0.5}Sr_{0.5}CoO_3$. The second intermediate layer 6 may be crystalline. The second intermediate layer 6 may be, for example, a laminate which is composed of at least two buffer layers selected from the group consisting of a layer containing a crystal of $BaTiO_3$, a layer containing a crystal of $SrRuO_3$, a layer containing a crystal of $LaNiO_3$, and a layer containing a crystal of $(La,Sr)CoO_3$. All of $BaTiO_3$, $SrRuO_3$, $LaNiO$, and $(La,Sr)CoO_3$ have a perovskite structure. Therefore, in a case where the second intermediate layer 6 contains at least one compound selected from the group consisting of $BaTiO$, $SrRuO_3$, $LaNiO_3$, and $(La,Sr)CoO_5$, the piezoelectric thin film 3 is likely to be epitaxially grown, the (001) plane of the tetragonal crystal 1 is likely to be oriented in the normal direction $D_N$ of the surface of the first electrode layer 7, the (001) plane of the tetragonal crystal 2 is likely to be inclined with respect to the (001) plane of the tetragonal crystal 1, c1/a1 is likely to be larger than c2/a2, and $\theta_{12}$ is easily controlled from 1.0° to 10.0°. Furthermore, the piezoelectric thin film 3 is easily in close contact with the first electrode layer 7 with the second intermediate layer 6 interposed therebetween. A crystal plane of the second intermediate layer 6 may be oriented in the normal direction $D_N$ of surface of the first electrode layer 7. The formation method of the second intermediate layer 6 may be a sputtering method, a vacuum deposition method, a printing method, a spin coat method, or a sol-gel method.

The second electrode layer 4 may consist of, for example, at least one metal selected from the group consisting of Pt, Pd, Rh, Au, Ru, Ir, Mo, Ti, Ta, and Ni. The second electrode layer 4 may consist of, for example, at least one conductive metal oxide selected from the group consisting of $LaNiO_3$, $SrRuO_3$, and $(La,Sr)CoO_3$. The second electrode layer 4 may be crystalline. A crystal plane of the second electrode layer 4 may be oriented in the normal direction $D_N$ of the first electrode layer 7. The crystal plane of the second electrode layer 4 may be substantially parallel to the surface of the first electrode layer 7. The crystal plane of the second electrode layer 4 oriented in the normal direction $D_N$ of the surface of the first electrode layer 7 may be substantially parallel to the (001) plane of the tetragonal crystal 1. The thickness of the second electrode layer 4 may be, for example, from 1 nm to 1.0 µm. The formation method of the second electrode layer 4 may be a sputtering method, a vacuum deposition method, a printing method, a spin coat method, or a sol-gel method. In the case of a printing method, a spin coat method, or a sol-gel method, the heating treatment (annealing) of the second electrode layer 4 may be performed in order to enhance the crystallinity of the second electrode layer 4.

Another intermediate layer (another second intermediate layer) may be disposed between the piezoelectric thin film 3 and the second electrode layer 4. The second electrode layer 4 is easily in close contact with the piezoelectric thin film 3 with the other intermediate layer interposed therebetween. The composition, crystalline structure, and formation method of the other intermediate layer (the other second intermediate layer) may be the same as those of the second intermediate layer 6 described above. The other intermediate layer may contain, for example, at least one selected from the group consisting of $SrRuO_3$, $LaNiO_3$, and $(La,Sr)CoO_3$. The formation method of the other intermediate layer may be a sputtering method, a vacuum deposition method, a printing method, a spin coat method, or a sol-gel method.

At least a part or whole of the surface of the piezoelectric thin film element 10 may be coated with a protective film. The durability (such as moisture resistance) of the piezoelectric thin film element 10 is improved by coating with the protective film.

A piezoelectric thin film element according to the present embodiment is used for various applications. For example, the piezoelectric thin film element may be used in a piezoelectric transducer and a piezoelectric sensor. That is, a piezoelectric transducer (for example, an ultrasonic transducer) according to the present embodiment may contain the above-described the piezoelectric thin film element. The piezoelectric transducer may be, for example, an ultrasonic transducer such as an ultrasonic sensor. The piezoelectric thin film element may be, for example, a harvester (vibration energy harvester). As described above, the piezoelectric thin film element according to the present embodiment has an excellent piezoelectric performance index, and thus the piezoelectric thin film element according to the present embodiment is suitable for an ultrasonic transducer. The piezoelectric thin film element may be a piezoelectric sensor. For example, the piezoelectric sensor may be a piezoelectric microphone, a gyroscope sensor, a pressure sensor, a pulse sensor, or a shock sensor. The piezoelectric thin film element may be a SAW filter, a BAW filter, an oscillator, or an acoustic multi-layer film. The above-described piezoelectric thin film element may be contained in micro electro mechanical systems (MEMS). That is, the piezoelectric thin film element may be a part or whole of the micro electro mechanical systems. For example, the piezoelectric thin film element may be a part or whole of piezoelectric micromachined ultrasonic transducers (PMUT). For example, products to which piezoelectric micromachined ultrasonic transducers are applied may be biometric sensors (such as a fingerprint authentication sensor and a vessel authentication sensor) or medical/healthcare sensors (such as a blood-pressure gauge and a vessel imaging sensor), or ToF (Time of Flight) sensors.

FIG. 5 illustrates a schematic cross-section of an ultrasonic transducer 10*a* containing the above-described piezoelectric thin film element. The cross-section of this ultrasonic transducer 10*a* is perpendicular to the surface of each of the first electrode layer 7 and the piezoelectric thin film 3. The ultrasonic transducer 10*a* may contain a substrate (8*a* and 8*b*), the first electrode layer 7 provided on the substrate (8*a* and 8*b*), the piezoelectric thin film 3 stacked on the first electrode layer 7, and the second electrode layer 4 stacked on the piezoelectric thin film 3. An acoustic cavity 8*c* may be provided below the piezoelectric thin film 3. An ultrasonic signal is transmitted or received by deflection or vibration of the piezoelectric thin film 3. The first intermediate layer may be interposed between the substrate (8*a* and 8*b*) and the first electrode layer 7. The second intermediate layer may be interposed between the first electrode layer 7 and the piezoelectric thin film 3.

EXAMPLES

The present invention will be specifically explained by means of the following Examples and Comparative Examples. The present invention is not limited by the following Examples.

Example 1

A crystalline substrate consisting of Si was used in the production of a piezoelectric thin film element of Example 1. A (100) plane of Si was parallel to the surface of the crystalline substrate. The crystalline substrate had a square shape of 20 mm×20 mm. The thickness of the crystalline substrate was 500 μm.

A crystalline first intermediate layer consisting of $ZrO_2$ and $Y_2O_3$ was formed on the entire surface of the crystalline substrate in a vacuum chamber. The first intermediate layer was formed by a sputtering method. The thickness of the first intermediate layer was 30 nm.

A first electrode layer consisting of a Pt crystal was formed on the entire surface of the first intermediate layer in the vacuum chamber. The first electrode layer was formed by a sputtering method. The thickness of the first electrode layer was 200 nm. The temperature inside the vacuum chamber in the formation process of the first electrode layer was maintained at 500° C.

An XRD pattern of the first electrode layer was measured by out-of-plane measurement in the surface of the first electrode layer. Another XRD pattern of the first electrode layer was measured by in-plane measurement in the surface of the first electrode layer. In the measurement of these XRD patterns, an X-ray diffraction apparatus (SmartLab) manufactured by Rigaku Corporation was used. Measurement conditions were set such that each peak intensity in each XRD pattern is higher than the background intensity by at least triple digits or more. A peak of diffracted X-rays of (002) planes of the Pt crystal was detected by out-of-plane measurement. That is, the (002) planes of the Pt crystal were oriented in the normal direction $D_N$ of the surface of the first electrode layer. A peak of diffracted X-ray of the (200) planes of the Pt crystal was detected by in-plane measurement. That is, the (200) planes of the Pt crystal were oriented in the in-plane direction of the surface of the first electrode layer.

By performing the above-described film formation step (PLD method) in the vacuum chamber, a piezoelectric thin film was formed directly on the entire surface of the first electrode layer. As the pulse laser light, KrF laser having a wavelength of 248 nm was used in the film formation step. The fluence of the pulse laser light was adjusted to a value shown in Table 1 below. The repetition frequency f1 of pulse laser light in the film formation step was adjusted to 10 Hz. The oxygen partial pressure in the vacuum chamber in the first film formation step was maintained at 1 Pa. The temperature (film-forming temperature) inside the vacuum chamber in the formation process of the first piezoelectric layer was maintained at 450° C. The thickness of the piezoelectric thin film was adjusted to 2000 nm.

The composition of the target used in the film formation step is represented by Chemical Formula 1 below. In the case of Example 1, $E^A$, $E^{B1}$, and $E^{B2}$ in Chemical Formula 1 below were elements shown in Table 1 below. In the case of Example 1, α, β, x1, and y1 in Chemical Formula 1 below were values shown in Table 1 below.

$$x1(Bi_{1-\alpha}E^A{}_\alpha)(E^B{}_{1-\beta}E^{B2}{}_\beta)O_3-y1BiFeO_3 \qquad (1)$$

The composition of the piezoelectric thin film was analyzed by an XRF method. The result of the analysis shows that the composition of the piezoelectric thin film is consistent with the composition of the target.

An XRD pattern of the piezoelectric thin film was measured by out-of-plane measurement in the surface of the first piezoelectric layer using the above-described X-ray diffraction apparatus. Further, another XRD pattern of the piezo-electric thin film was measured by in-plane measurement in the surface of the first piezoelectric layer. A reciprocal space mapping of the piezoelectric thin film was performed by these measurements. Measurement conditions were set such that each peak intensity in each XRD pattern is higher than the background intensity by at least single digit or more. The measurement apparatus and measurement conditions of each XRD pattern were the same as those described above. The reciprocal space map of Example 1 is shown in FIG. 6A and FIG. 6B.

The results of analysis using the X-ray diffraction appa-ratus showed that the piezoelectric thin film had the follow-ing features.

The piezoelectric thin film consisted of a tetragonal crystal 1 of a perovskite-type oxide and a tetragonal crystal 2 of a perovskite-type oxide. It was difficult to discriminate the tetragonal crystal 1 and the tetragonal crystal 2 from each other based on their compositions.

A (001) plane of the tetragonal crystal 1 was oriented preferentially in the normal direction $D_N$ of the surface of the first electrode layer. That is, the orientation degree of the (001) plane of the tetragonal crystal 1 in the normal direction $D_N$ of the surface of the first electrode layer was 90% or more. As described above, the orientation degree of the (001) plane of the tetragonal crystal 1 is represented as $100 \times I_{1(001)}/(I_{1(001)}+I_{1(110)}+I_{1(111)})$. The crystal plane of the tetragonal crystal 1 preferentially oriented in the normal direction $D_N$ of the surface of the first electrode layer is described as "oriented plane" in each Table below.

A (001) plane of the tetragonal crystal 2 was inclined with respect to the (001) plane of the tetragonal crystal 1.

c1/a1 of the tetragonal crystal 1 was larger than c2/a2 of the tetragonal crystal 2.

$\theta_{12}$ of Example 1 was a value shown in Table 1 below. The definition of $\theta_{12}$ is as described above.

c1/a1 of Example 1 was a value shown in Table 2 below.

c2/a2 of Example 1 was a value shown in Table 2 below.

$100 \times I_2/(I_1+I_2)$ of Example 1 was a value shown in Table 2 below. The definition of $100 \times I_2/(I_1+I_2)$ is as described above.

A second electrode layer consisting of Pt was formed on the entire surface of the piezoelectric thin film in the vacuum chamber. The second electrode layer was formed by a sputtering method. The temperature of the crystalline sub-strate in the formation process of the second electrode layer was maintained at 500° C. The thickness of the second electrode layer was 200 nm.

A laminate of Example 1 was produced by the above steps. The laminate structure on the crystalline substrate was patterned by the subsequent photolithography. After the patterning, the laminate was cut by dicing.

A piezoelectric thin film element of Example 1 having a quadrangular shape of Example 1 was obtained by the above steps. The piezoelectric thin film element was composed of the crystalline substrate, the first intermediate layer directly stacked on the crystalline substrate, the first electrode layer directly stacked on the first intermediate layer, the piezo-electric thin film directly stacked on the first electrode layer, and the second electrode layer directly stacked on the piezoelectric thin film. The area of the movable part of the piezoelectric thin film was 600 μm×600 μm.

<Evaluation of Piezoelectric Properties>

Piezoelectric properties of the piezoelectric thin film were evaluated by the following method.

[Calculation of Relative Permittivity]

The capacitance C of the piezoelectric thin film element was measured. The details of measurement of the capaci-tance C was as described below.

Measurement apparatus: Impedance Gain-Phase Analyzer 4194A manufactured by Hewlett Packard Enterprise Development LP Frequency: 1 kHz Electric field: 10 V/μm The relative permittivity Er was calculated based on Mathematical Formula A below from the measured value of the capacitance C. $\varepsilon_r$ of Example 1 is shown in Table 2 below.

$$C = \varepsilon_0 \times \varepsilon_r \times (S/d) \tag{A}$$

$\varepsilon_0$ in Mathematical Formula A is a permittivity of vacuum ($8.854 \times 10^{-12}$ Fm$^{-1}$). S in Mathematical Formula A is an area of the surface of the piezoelectric thin film. S is restated as an area of the first electrode layer stacked on the piezoelec-tric thin film. d in Mathematical Formula A is a thickness of the piezoelectric thin film.

[Measurement of Piezoelectric Strain Constant $d_{33,f}$]

The piezoelectric strain constant $d_{33,f}$ of the piezoelectric thin film was measured using the piezoelectric thin film element. The details of measurement of $d_{33,f}$ was as described below. The piezoelectric strain constant di f(av-erage value of three measurement points) of Example 1 is shown in Table 2 below. The piezoelectric performance index ($d_{33,f}/\varepsilon_r\varepsilon_0$) was calculated from $d_{33,f}$ and $\varepsilon_r$. $d_{33,f}/\varepsilon_r\varepsilon_0$ of Example 1 is shown in Table 2 below.

Measurement apparatus: $d_{33}$ meter (ZJ-4B) manufactured by Chinese Academy of Sciences Frequency: 110 Hz Clamping pressure: 0.25 N Examples 2 to 10 and Comparative Examples 1 and 2

The composition of the target of each of Examples 2 to 10 and Comparative Examples 1 and 2 is represented by Chemical Formula 1 above. $E^A$, $E^{B1}$, and $E^{B2}$ of each of Examples 2 to 10 and Comparative Examples 1 and 2 were elements shown in Table 1 below. $\alpha$, $\beta$, x1, and y1 of each of Examples 2 to 10 and Comparative Examples 1 and 2 were values shown in Table 1 below. Only the fluence of the pulse laser light of Comparative Example 2 among Examples 2 to 10 and Comparative Examples 1 and 2 was different from the fluence of Example 1. The fluence of Comparative Example 2 was adjusted to a value shown in Table 1 below.

A piezoelectric thin film element of each of Examples 2 to 10 and Comparative Examples 1 and 2 was produced by the same method as in Example 1 except for the above matters.

Analysis and measurement for the piezoelectric thin film of each of Examples 2 to 10 and Comparative Examples 1 and 2 were performed by the same method as in Example 1.

In all cases of Examples 2 to 10 and Comparative Examples 1 and 2, the composition of the piezoelectric thin film was consistent with the composition of the target.

In all cases of Examples 2 to 10 and Comparative Example 1, the piezoelectric thin film consisted of the tetragonal crystal 1 of the perovskite-type oxide and the tetragonal crystal 2 of the perovskite-type oxide. It was difficult to discriminate the tetragonal crystal 1 and the tetragonal crystal 2 from each other based on their compositions.

The piezoelectric thin film of Comparative Example 2 consisted only of the tetragonal crystal 1 of a perovskite-type oxide. That is, the piezoelectric thin film of Comparative Example 2 did not contain the tetragonal crystal 2.

In all cases of Examples 2 to 10 and Comparative Examples 1 and 2, the (001) plane of the tetragonal crystal 1 was oriented preferentially in the normal direction $D_N$ of the surface of the first electrode layer.

In all cases of Examples 2 to 10, the (001) plane of the tetragonal crystal 2 was inclined with respect to the (001) plane of the tetragonal crystal 1.

In the case of Comparative Example 1, the (001) plane of the tetragonal crystal 2 was not inclined with respect to the (001) plane of the tetragonal crystal 1. That is, in the case of Comparative Example 1, not only the (001) plane of the tetragonal crystal 1 but also the (001) plane of the tetragonal crystal 2 were oriented in the normal direction $D_N$ of the surface of the first electrode layer.

In all cases of Examples 2 to 10 and Comparative Example 1, c1/a1 of the tetragonal crystal 1 was larger than c2/a2 of the tetragonal crystal 2.

$\theta_{12}$ of each of Examples 2 to 10 and Comparative Example 1 was a value shown in Table 1 below.

c1/a1 of each of Examples 2 to 10 and Comparative Examples 1 and 2 was a value shown in Table 2 below.

c2/a2 of each of Examples 2 to 10 and Comparative Example 1 was a value shown in Table 2 below.

$100 \times I_2/(I_1+I_2)$ of each of Examples 2 to 10 and Comparative Example 1 was a value shown in Table 2 below.

The piezoelectric properties of the piezoelectric thin film of each of Examples 2 to 10 and Comparative Examples 1 and 2 were evaluated by the same method as in Example 1. $\varepsilon_r$, $d_{33,f}$ and $d_{33,f}/\varepsilon_r\varepsilon_0$ of each of Examples 2 to 10 and Comparative Examples 1 and 2 were shown in Table 2 below.

TABLE 2

| Unit | $\varepsilon_r$ — | $d_{33,f}$ pC/N | $d_{33,f}/\varepsilon_0\varepsilon_r$ $\times10^{-3}$ V·m/N | $100 \times I_2/$ $(I_1 + I_2)$ % | c1/a1 — | c2/a2 — |
|---|---|---|---|---|---|---|
| Example 1 | 55 | 120 | 246 | 1.8 | 1.225 | 1.042 |
| Example 2 | 58 | 103 | 201 | 3.0 | 1.193 | 1.032 |
| Example 3 | 54 | 117 | 245 | 0.4 | 1.211 | 1.064 |
| Example 4 | 51 | 102 | 226 | 1.8 | 1.182 | 1.039 |
| Example 5 | 57 | 106 | 210 | 4.5 | 1.176 | 1.028 |
| Example 6 | 59 | 119 | 228 | 6.1 | 1.120 | 1.073 |
| Example 7 | 61 | 113 | 209 | 3.6 | 1.153 | 1.051 |
| Example 8 | 62 | 110 | 200 | 2.0 | 1.134 | 1.014 |
| Example 9 | 41 | 84 | 231 | 9.8 | 1.261 | 1.111 |
| Example 10 | 52 | 102 | 222 | 0.9 | 1.158 | 1.092 |
| Comparative Example 1 | 113 | 140 | 140 | 8.1 | 1.110 | 1.055 |
| Comparative Example 2 | 82 | 60 | 83 | 0.0 | 1.252 | — |

Comparative Example 3

As shown in Table 3, the temperature (film-forming temperature) inside the vacuum chamber in the film formation step of Comparative Example 3 was maintained at 700° C. A piezoelectric thin film element of Comparative Example 3 was produced by the same method as in Example 1 except for the film-forming temperature.

Analysis and measurement for the piezoelectric thin film of Comparative Example 3 were performed by the same method as in Example 1. The piezoelectric thin film of Comparative Example 3 did not have crystallinity. That is, both the tetragonal crystal 1 and the tetragonal crystal 2 were not detected from the piezoelectric thin film of Comparative Example 3. As a result, the oriented plane, $\theta_{12}$, c1/a1, c2/a2, and $100 \times I_2/(I_1+I_2)$ of Comparative Example 3 could not be measured.

The piezoelectric properties of the piezoelectric thin film of Comparative Example 3 were evaluated by the same method as in Example 1. $\varepsilon_r$, $d_{33,f}$ and $d_{33,f}/\varepsilon_r\varepsilon_0$ of Comparative Example 3 were shown in Table 4 below.

TABLE 1

| Unit | Fluence mJ/mm² | $E^{A1}$ — | $E^{B1}$ — | $E^{B2}$ — | α — | β — | x1 — | y1 — | Oriented plane — | $\theta_{12}$ degree |
|---|---|---|---|---|---|---|---|---|---|---|
| Example 1 | 10 | K | Ti | None | 0.5 | 0.0 | 0.10 | 0.90 | (001) | 3.5 |
| Example 2 | 10 | Na | Zr | None | 0.5 | 0.0 | 0.20 | 0.80 | (001) | 1.0 |
| Example 3 | 10 | Ag | Zr | None | 0.5 | 0.0 | 0.05 | 0.95 | (001) | 5.4 |
| Example 4 | 10 | None | Al | None | 0.0 | 0.0 | 0.10 | 0.90 | (001) | 8.4 |
| Example 5 | 10 | Na | Ti | None | 0.5 | 0.0 | 0.85 | 0.15 | (001) | 10.0 |
| Example 6 | 10 | Ba | Mg | Ti | 0.5 | 0.5 | 0.50 | 0.50 | (001) | 2.5 |
| Example 7 | 10 | K | Mg | Ti | 0.5 | 0.5 | 0.15 | 0.85 | (001) | 7.2 |
| Example 8 | 10 | None | Mg | Ti | 1.0 | 0.0 | 0.30 | 0.70 | (001) | 9.3 |
| Example 9 | 10 | Ag | Ti | None | 0.5 | 0.0 | 0.70 | 0.30 | (001) | 3.5 |
| Example 10 | 10 | None | Zn | Ti | 0.0 | 0.5 | 0.90 | 0.10 | (001) | 2.1 |
| Comparative Example 1 | 25 | K | Mg | Ti | 0.5 | 0.5 | 0.50 | 0.50 | (001) | 0.0 |
| Comparative Example 2 | 10 | None | Zn | Ti | 0.0 | 0.0 | 1.00 | 0.00 | (001) | — |

TABLE 3

| Unit | Film forming temperature ° C. | Fluence mJ/mm² | $E^A$ — | $E^{B1}$ — | $E^{B2}$ — | α — | β — | x1 — | y1 — | Oriented plane — | $\theta_{12}$ degree |
|---|---|---|---|---|---|---|---|---|---|---|---|
| Example 1 | 450 | 10 | K | Ti | None | 0.5 | 0.0 | 0.10 | 0.90 | (001) | 3.5 |
| Comparative Example 3 | 700 | 10 | K | Ti | None | 0.5 | 0.0 | 0.10 | 0.90 | None | — |

TABLE 4

| Unit | $\varepsilon_r$ — | $d_{33,f}$ pC/N | $d_{33,f}/\varepsilon_0\varepsilon_r$ ×10⁻³ V·m/N | $100 \times I_2/(I_1 + I_2)$ % | c1/a1 — | c2/a2 — |
|---|---|---|---|---|---|---|
| Example 1 | 55 | 120 | 246 | 1.8 | 1.225 | 1.042 |
| Comparative Example 3 | 253 | 30 | 13 | — | — | — |

Examples 11 to 13

In all cases of Examples 11 to 13, the second intermediate layer was formed on the entire surface of the first electrode layer, and the piezoelectric thin film was formed on the entire surface of the second intermediate layer. The second intermediate layer of Example 11 consisted of crystalline SrRuO₃. The thickness of the second intermediate layer of Example 11 was 50 nm. The second intermediate layer of Example 12 consisted of crystalline LaNiO₃. The thickness In all cases of Examples 11 to 13, the (001) plane of the tetragonal crystal 1 was oriented preferentially in the normal direction $D_N$ of the surface of the first electrode layer.

In all cases of Examples 11 to 13, the (001) plane of the tetragonal crystal 2 was inclined with respect to the (001) plane of the tetragonal crystal 1.

In all cases of Examples 11 to 13, c1/a1 of the tetragonal crystal 1 was larger than c2/a2 of the tetragonal crystal 2.

$\theta_{12}$ of each of Examples 11 to 13 was a value shown in Table 5 below.

c1/a1 of each of Examples 11 to 13 was a value shown in Table 6 below.

c2/a2 of each of Examples 11 to 13 was a value shown in Table 6 below.

$100 \times I_2/(I_1+I_2)$ of each of Examples 11 to 13 was a value shown in Table 6 below.

The piezoelectric properties of the piezoelectric thin film of each of Examples 11 to 13 were evaluated by the same method as in Example 1. $\varepsilon_r$, $d_{33,f}$, and $d_{33,f}/\varepsilon_r\varepsilon_0$ of each of Examples 11 to 13 were shown in Table 6 below.

TABLE 5

| Unit | Fluence mJ/mm² — | $E^A$ — | $E^{B1}$ — | $E^{B2}$ — | α — | β — | x1 — | y1 — | Oriented plane — | Second intermediate layer — | $\theta_{12}$ degree |
|---|---|---|---|---|---|---|---|---|---|---|---|
| Example 1 | 10 | K | Ti | None | 0.5 | 0.0 | 0.10 | 0.90 | (001) | None | 3.5 |
| Example 11 | 10 | K | Ti | None | 0.5 | 0.0 | 0.10 | 0.90 | (001) | SRO | 3.0 |
| Example 12 | 10 | K | Ti | None | 0.5 | 0.0 | 0.10 | 0.90 | (001) | LNO | 2.5 |
| Example 13 | 10 | K | Ti | None | 0.5 | 0.0 | 0.10 | 0.90 | (001) | BTO | 3.6 | of the second intermediate layer of Example 12 was 50 nm. The second intermediate layer of Example 13 consisted of crystalline BaTiO₃. The thickness of the second intermediate layer of Example 13 was 50 nm. In all cases of Examples 11 to 13, the (001) plane of the second intermediate layer was oriented in the normal direction $D_N$ of the surface of the first electrode layer. "SRO" in Table 5 below means SrRuO₃. "LNO" in Table 5 below means LaNiO₃. "BTO" in Table 5 below means BaTiO₃.

A piezoelectric thin film element of each of Examples 11 to 13 was produced by the same method as in Example 1, except that the second intermediate layer was formed.

Analysis and measurement for the piezoelectric thin film of each of Examples 11 to 13 were performed by the same method as in Example 1.

In all cases of Examples 11 to 13, the composition of the piezoelectric thin film was consistent with the composition of the target.

In all cases of Examples 11 to 13, the piezoelectric thin film consisted of the tetragonal crystal 1 of the perovskite-type oxide and the tetragonal crystal 2 of the perovskite-type oxide. It was difficult to discriminate the tetragonal crystal 1 and the tetragonal crystal 2 from each other based on their compositions.

TABLE 6

| Unit | $\varepsilon_r$ — | $d_{33,f}$ pC/N | $d_{33,f}/\varepsilon_0\varepsilon_r$ ×10⁻³ V·m/N | $100 \times I_2/(I_1 + I_2)$ % | c1/a1 — | c2/a2 — |
|---|---|---|---|---|---|---|
| Example 1 | 55 | 120 | 246 | 1.8 | 1.225 | 1.042 |
| Example 11 | 56 | 121 | 244 | 2.2 | 1.210 | 1.037 |
| Example 12 | 51 | 109 | 241 | 0.9 | 1.249 | 1.049 |
| Example 13 | 63 | 123 | 221 | 4.9 | 1.267 | 1.028 |

Example 14

In the production process of the piezoelectric thin film element of Example 14, the first intermediate layer and the second intermediate layer were not formed. In the production process of the piezoelectric thin film element of Example 14, the first electrode layer consisting of crystalline SrRuO₃ was formed directly on the entire surface of the crystalline substrate. A (001) plane of SrRuO₃ was oriented in the normal direction $D_N$ of the surface of the first electrode layer. The thickness of the first electrode layer of Example 14 was 200 nm.

A piezoelectric thin film element of Example 14 was produced by the same method as in Example 1 except for the above matters.

Measurement for the first electrode layer of Example 14 was performed by the same method as in Example 1. In the case of Example 14, the crystal plane of the first electrode layer was not oriented in the in-plane direction of the surface of the first electrode layer. That is, in the case of Example 14, there was not the in-plane orientation of the crystal of the first electrode layer.

Analysis and measurement for the piezoelectric thin film of Example 14 were performed by the same method as in Example 1.

In the case of Example 14, the composition of the piezoelectric thin film was consistent with the composition of the target.

In the case of Example 14, the piezoelectric thin film consisted of the tetragonal crystal 1 of the perovskite-type oxide and the tetragonal crystal 2 of the perovskite-type oxide. It was difficult to discriminate the tetragonal crystal 1 and the tetragonal crystal 2 from each other based on their compositions.

In the case of Example 14, the (001) plane of the tetragonal crystal 1 was oriented preferentially in the normal direction $D_N$ of the surface of the first electrode layer.

In the case of Example 14, the (001) plane of the tetragonal crystal 2 was inclined with respect to the (001) plane of the tetragonal crystal 1.

In the case of Example 14, c1/a1 of the tetragonal crystal 1 was larger than c2/a2 of the tetragonal crystal 2.

$\theta_{12}$ of Example 14 was a value shown in Table 7 below.

c1/a1 of Example 14 was a value shown in Table 8 below.

c2/a2 of Example 14 was a value shown in Table 8 below.

$100 \times I_2/(I_1+I_2)$ of Example 14 was a value shown in Table 8 below.

The piezoelectric properties of the piezoelectric thin film of Example 14 were evaluated by the same method as in Example 1. Er, $d_{33,f}$, and $d_{33,f}/\varepsilon_r\varepsilon_0$ of Example 14 were shown in Table 8 below.

Analysis and measurement for the piezoelectric thin film of each of Examples 15 and 16 and Comparative Examples 4 and 5 were performed by the same method as in Example 1.

In all cases of Examples 15 and 16 and Comparative Examples 4 and 5, the composition of the piezoelectric thin film was consistent with the composition of the target.

The piezoelectric thin film of Comparative Example 4 did not have crystallinity. That is, both the tetragonal crystal 1 and the tetragonal crystal 2 were not detected from the piezoelectric thin film of Comparative Example 4. As a result, the oriented plane, $\theta_{12}$, c1/a1, c2/a2, and $100 \times I_2/(I_1+I_2)$ of Comparative Example 4 could not be measured.

In all cases of Examples 15 and 16 and Comparative Example 5, the piezoelectric thin film consisted of the tetragonal crystal 1 of the perovskite-type oxide and the tetragonal crystal 2 of the perovskite-type oxide. It was difficult to discriminate the tetragonal crystal 1 and the tetragonal crystal 2 from each other based on their compositions.

In all cases of 15 and 16 and Comparative Example 5, the (001) plane of the tetragonal crystal 1 was oriented preferentially in the normal direction $D_N$ of the surface of the first electrode layer.

In the cases of Examples 15 and 16, the (001) plane of the tetragonal crystal 2 was inclined with respect to the (001) plane of the tetragonal crystal 1.

In the case of Comparative Example 5, the (001) plane of the tetragonal crystal 2 was not inclined with respect to the (001) plane of the tetragonal crystal 1. That is, in the case of Comparative Example 5, not only the (001) plane of the tetragonal crystal 1 but also the (001) plane of the tetragonal crystal 2 were oriented in the normal direction $D_N$ of the surface of the first electrode layer.

In all cases of Examples 15 and 16 and Comparative Example 5, c1/a1 of the tetragonal crystal 1 was larger than c2/a2 of the tetragonal crystal 2.

$\theta_{12}$ of each of Examples 15 and 16 and Comparative Example 5 was a value shown in Table 9 below.

TABLE 7

| Unit | Fluence mJ/mm$^2$ | E$^A$ — | E$^{B1}$ — | E$^{B2}$ — | $\alpha$ — | $\beta$ — | x1 — | y1 — | Oriented plane — | In-plane orientation — | $\theta_{12}$ degree |
|---|---|---|---|---|---|---|---|---|---|---|---|
| Example 1 | 10 | K | Ti | None | 0.5 | 0.0 | 0.10 | 0.90 | (001) | Present | 3.5 |
| Example 14 | 10 | K | Ti | None | 0.5 | 0.0 | 0.10 | 0.90 | (001) | Absent | 1.2 |

TABLE 8

| Unit | $\varepsilon_r$ — | $d_{33,f}$ pC/N | $d_{33,f}/\varepsilon_0\varepsilon_r$ ×10$^{-3}$ V·m/N | $100 \times I_2/(I_1+I_2)$ % | c1/a1 — | c2/a2 — |
|---|---|---|---|---|---|---|
| Example 1 | 55 | 120 | 246 | 1.8 | 1.225 | 1.042 |
| Example 14 | 64 | 129 | 228 | 0.6 | 1.142 | 1.015 |

Examples 15 and 16 and Comparative Examples 4 and 5

The fluence of the pulse laser light of each of Examples 15 and 16 and Comparative Examples 4 and 5 was adjusted to a value shown in Table 9 below. A piezoelectric thin film element of each of Examples 15 and 16 and Comparative Examples 4 and 5 was produced by the same method as in Example 1 except for the fluence.

c1/a1 of each of Examples 15 and 16 and Comparative Example 5 was a value shown in Table 10 below.

c2/a2 of each of Examples 15 and 16 and Comparative Example 5 was a value shown in Table 10 below.

$100 \times I_2/(I_1+I_2)$ of each of Examples 15 and 16 and Comparative Example 5 was a value shown in Table 10 below.

The piezoelectric properties of the piezoelectric thin film of each of Examples 15 and 16 and Comparative Examples 4 and 5 were evaluated by the same method as in Example 1. $\varepsilon_r$, $d_{33,f}$, and $d_{33,f}/\varepsilon_r\varepsilon_0$ of each of Examples 15 and 16 and Comparative Examples 4 and 5 were shown in Table 10 below. However, the piezoelectric thin film of Comparative Example 4 did not have sufficient piezoelectric properties. Since $d_{33,f}$ of Comparative Example 4 could not be measured, $d_{33,f}/\varepsilon_r\varepsilon_0$ of Comparative Example 4 was not specified.

TABLE 9

| Unit | Fluence mJ/mm² | E^{A1} — | E^{B1} — | E^{B2} — | α — | β — | x1 — | y1 — | Oriented plane — | θ_{12} degree |
|---|---|---|---|---|---|---|---|---|---|---|
| Comparative Example 4 | 5 | K | Ti | None | 0.5 | 0.0 | 0.10 | 0.90 | None | — |
| Example 15 | 8 | K | Ti | None | 0.5 | 0.0 | 0.10 | 0.90 | (001) | 4.2 |
| Example 1 | 10 | K | Ti | None | 0.5 | 0.0 | 0.10 | 0.90 | (001) | 3.5 |
| Example 16 | 12 | K | Ti | None | 0.5 | 0.0 | 0.10 | 0.90 | (001) | 1.8 |
| Comparative Example 5 | 15 | K | Ti | None | 0.5 | 0.0 | 0.10 | 0.90 | (001) | 0.0 |

TABLE 10

| Unit | $\varepsilon_r$ — | $d_{33,f}$ pC/N | $d_{33,f}/\varepsilon_0\varepsilon_r$ ×10⁻³ V·m/N | $100 \times I_2/(I_1+I_2)$ % | c1/a1 — | c2/a2 — |
|---|---|---|---|---|---|---|
| Comparative Example 4 | 130 | — | — | — | — | — |
| Example 15 | 61 | 126 | 233 | 1.5 | 1.190 | 1.037 |
| Example 1 | 55 | 120 | 246 | 1.8 | 1.225 | 1.042 |
| Example 16 | 50 | 105 | 237 | 3.6 | 1.230 | 1.045 |
| Comparative Example 5 | 41 | 60 | 165 | 5.3 | 1.240 | 1.040 |

INDUSTRIAL APPLICABILITY

For example, the piezoelectric thin film element according to an aspect of the present invention may be applied to a piezoelectric transducer and a piezoelectric sensor.

REFERENCE SIGNS LIST

3: piezoelectric thin film, 4: second electrode layer, 5: first intermediate layer, 6: second intermediate layer, 7: first electrode layer, 8: crystalline substrate, 8a, 8b: substrate, 10: piezoelectric thin film element, 10a: ultrasonic transducer (piezoelectric thin film element), $D_N$: normal direction of surface of first electrode layer, dn: normal direction of surface of piezoelectric thin film, uc: unit cell of perovskite structure, uc1: unit cell of tetragonal crystal 1, uc2: unit cell of tetragonal crystal 2.

What is claimed is:

1. A piezoelectric thin film element comprising:
an electrode layer; and
a piezoelectric thin film directly or indirectly stacked on the electrode layer,
wherein the piezoelectric thin film contains a tetragonal crystal 1 of a perovskite-type oxide and a tetragonal crystal 2 of a perovskite-type oxide,
a (001) plane of the tetragonal crystal 1 is oriented in a normal direction of a surface of the electrode layer,
a (001) plane of the tetragonal crystal 2 is inclined with respect to the (001) plane of the tetragonal crystal 1,
a spacing of (001) planes of the tetragonal crystal 1 is c1,
a spacing of (100) planes of the tetragonal crystal 1 is a1,
a spacing of (001) planes of the tetragonal crystal 2 is c2,
a spacing of (100) planes of the tetragonal crystal 2 is a2, and
c1/a1 is larger than c2/a2.

2. The piezoelectric thin film element according to claim 1,
wherein an absolute value of an angle between the (001) plane of the tetragonal crystal 1 and the (001) plane of the tetragonal crystal 2 is $\theta_{12}$, and
the $\theta_{12}$ is from 1.0° to 10.0°.

3. The piezoelectric thin film element according to claim 1,
wherein the c1/a1 is from 1.120 to 1.270.

4. The piezoelectric thin film element according to claim 1,
wherein the c2/a2 is from 1.010 to 1.115.

5. The piezoelectric thin film element according to claim 1,
wherein a peak intensity of diffracted X-rays of the (001) plane of the tetragonal crystal 1 is $I_1$,
a peak intensity of diffracted X-rays of the (001) plane of the tetragonal crystal 2 is 12, and
$100 \times I_2/(I_1+I_2)$ is from 0.30 to 10.0.

6. The piezoelectric thin film element according to claim 1,
wherein the tetragonal crystal 1 contains bismuth, iron, an element $E^B$, and oxygen, and
the element $E^B$ is at least one element selected from the group consisting of magnesium, aluminum, zirconium, titanium, nickel, and zinc.

7. The piezoelectric thin film element according to claim 1,
wherein the tetragonal crystal 1 is represented by Chemical Formula 1 below,
$E^A$ in Chemical Formula 1 below is at least one element selected from the group consisting of Na, K, Ag, and Ba,
$E^{B1}$ in Chemical Formula 1 below is at least one element selected from the group consisting of Mg, Al, Zr, Ti, Ni, and Zn,
$E^{B2}$ in Chemical Formula 1 below is at least one element selected from the group consisting of Mg, Al, Zr, Ti, Ni, and Zn,
the $E^{B1}$ and the $E^{B2}$ in Chemical Formula 1 below are different from each other,
x1 in Chemical Formula 1 below is from 0.05 to 0.90,
y1 in Chemical Formula 1 below is from 0.10 to 0.95,
x1+y1 is 1.00,
α in Chemical Formula 1 below is from 0.00 to 1.00, and
β in Chemical Formula 1 below is from 0.00 to 1.00:

$$x1(Bi_{1-\alpha}E^A{}_\alpha)(E^{B1}{}_{1-\beta}E^{B2}{}_\beta)O_3-y1BiFeO_3 \qquad (1).$$

8. The piezoelectric thin film element according to claim 1,
wherein the tetragonal crystal 2 contains bismuth, iron, an element $E^B$, and oxygen, and
the element $E^B$ is at least one element selected from the group consisting of magnesium, aluminum, zirconium, titanium, nickel, and zinc.

9. The piezoelectric thin film element according to claim 1,
wherein the tetragonal crystal 2 is represented by Chemical Formula 2 below, $E^A$ in Chemical Formula 2 below is at least one element selected from the group consisting of Na, K, Ag, and Ba, $E^{B1}$ in Chemical Formula 2 below is at least one element selected from the group consisting of Mg, Al, Zr, Ti, Ni, and Zn, $E^{B2}$ in Chemical Formula 2 below is at least one element selected from the group consisting of Mg, Al, Zr, Ti, Ni, and Zn, the $E^{B1}$ and the $E^{B2}$ in Chemical Formula 2 below are different from each other, x2 in Chemical Formula 2 below is from 0.05 to 0.90, y2 in Chemical Formula 2 below is from 0.10 to 0.95, x2+y2 is 1.00, α in Chemical Formula 2 below is from 0.00 to 1.00, and β in Chemical Formula 2 below is from 0.00 to 1.00:

$$x2(Bi_{1-\alpha}E^A{}_\alpha)(E^{B1}{}_{1-\beta}E^{B2}{}_\beta)O_3 - y2BiFeO_3 \qquad (2).$$

10. The piezoelectric thin film element according to claim 1, further comprising a crystalline substrate and a first intermediate layer, wherein the first intermediate layer is disposed between the crystalline substrate and the electrode layer, and the first intermediate layer contains $ZrO_2$ and $Y_2O_3$.

11. The piezoelectric thin film element according to claim 1, further comprising a second intermediate layer, wherein the second intermediate layer is disposed between the electrode layer and the piezoelectric thin film, and the second intermediate layer contains at least one compound selected from the group consisting of $BaTiO_3$, $SrRuO_3$, and $LaNiO_3$.

12. The piezoelectric thin film element according to claim 1, wherein the electrode layer contains a platinum crystal, a (002) plane of the platinum crystal is oriented in the normal direction of the surface of the electrode layer, and a (200) plane of the platinum crystal is oriented in an in-plane direction of the surface of the electrode layer.

13. A piezoelectric transducer comprising the piezoelectric thin film element according to claim 1.

* * * * *